(12) United States Patent
Itabashi et al.

(10) Patent No.: US 7,931,776 B2
(45) Date of Patent: Apr. 26, 2011

(54) PLASMA PROCESSING APPARATUS

(75) Inventors: Naoshi Itabashi, Hachioji (JP);
Tsutomu Tetsuka, Kasumigaura (JP);
Seiichiro Kanno, Kudamatsu (JP);
Motohiko Yoshigai, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 949 days.

(21) Appl. No.: 11/512,339

(22) Filed: Aug. 30, 2006

(65) Prior Publication Data

US 2007/0215282 A1 Sep. 20, 2007

(30) Foreign Application Priority Data

Mar. 15, 2006 (JP) ................................ 2006-071027

(51) Int. Cl.
*C23C 16/00* (2006.01)
*C23F 1/00* (2006.01)
*H01L 21/306* (2006.01)
*H01L 21/683* (2006.01)
*H01T 23/00* (2006.01)

(52) U.S. Cl. ......... 156/345.24; 156/345.28; 156/345.51; 156/345.52; 156/345.53; 156/345.54; 156/345.55; 118/723 E; 118/723 ER; 361/234

(58) Field of Classification Search ............ 156/345.24, 156/345.48, 345.51–345.55; 118/723 E, 118/723 ER; 361/234
See application file for complete search history.

(56) References Cited

U.S. PATENT DOCUMENTS

| 6,184,687 B1 * | 2/2001 | Yamage et al. ............... 324/464 |
| 6,620,247 B2 * | 9/2003 | Ebe et al. ..................... 118/689 |
| 6,878,233 B2 * | 4/2005 | Hirose ..................... 156/345.28 |
| 6,929,712 B2 * | 8/2005 | Hanazaki et al. ........ 156/345.28 |
| 2003/0102083 A1 * | 6/2003 | Sasaki et al. ............. 156/345.24 |
| 2004/0149384 A1 * | 8/2004 | Kanno et al. ............. 156/345.24 |
| 2006/0032584 A1 * | 2/2006 | Itabashi et al. ........... 156/345.44 |
| 2009/0165951 A1 | 7/2009 | Itabashi et al. |

FOREIGN PATENT DOCUMENTS

| JP | 8-330095 | 12/1996 |
| JP | 2003-282542 | 10/2003 |
| JP | 2003-282545 | 10/2003 |
| JP | 2006-054148 | 2/2006 |

OTHER PUBLICATIONS

Japanese Office Action issued in Japanese Patent Application No. 2006-071027, dated Oct. 15, 2010.

\* cited by examiner

*Primary Examiner* — Parviz Hassanzadeh
*Assistant Examiner* — Rakesh Dhingra
(74) *Attorney, Agent, or Firm* — McDermott Will & Emery LLP

(57) ABSTRACT

A plasma processing apparatus including a chamber having an inner wall with a protective film thereon and a sample stage disposed in the chamber in which plasma is generated by supplying high-frequency wave energy to processing gas to conduct plasma processing for a sample on the sample stage using the plasma. The apparatus includes a control device which determines, based on monitor values of a wafer attracting current monitor (Ip) to monitor a current supplied from a wafer attracting power source, an impedance monitor (Zp) to monitor plasma impedance viewed from a plasma generating power source, and an impedance monitor (Zb) to monitor a plasma impedance viewed from a bias power supply, presence or absence of occurrence of an associated one of abnormal discharge in inner parts, deterioration in insulation of an insulating film of a wafer attracting electrode, and abnormal injection in a gas injection plate.

7 Claims, 12 Drawing Sheets

FIG. 4
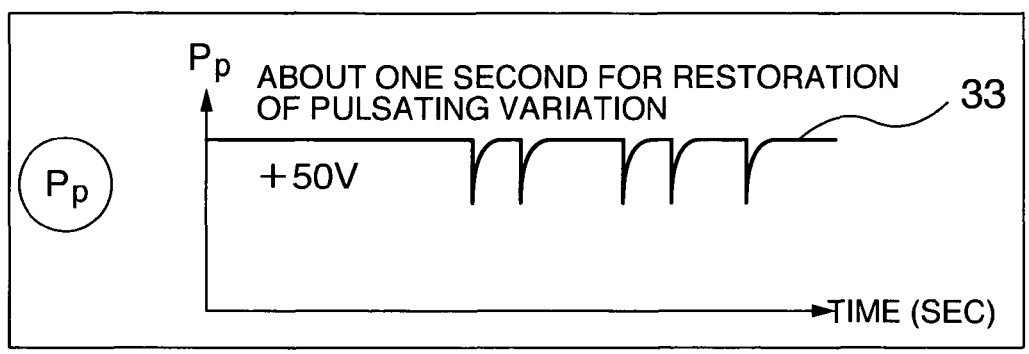
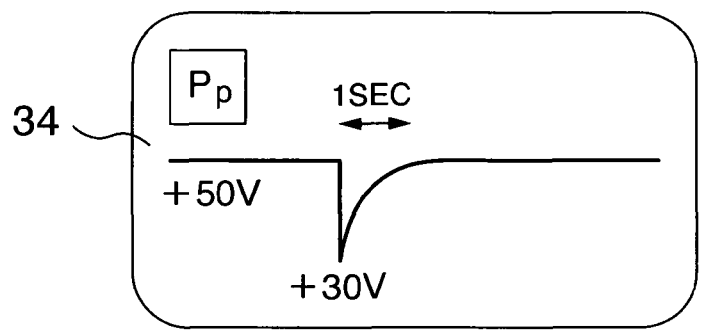

FIG. 5
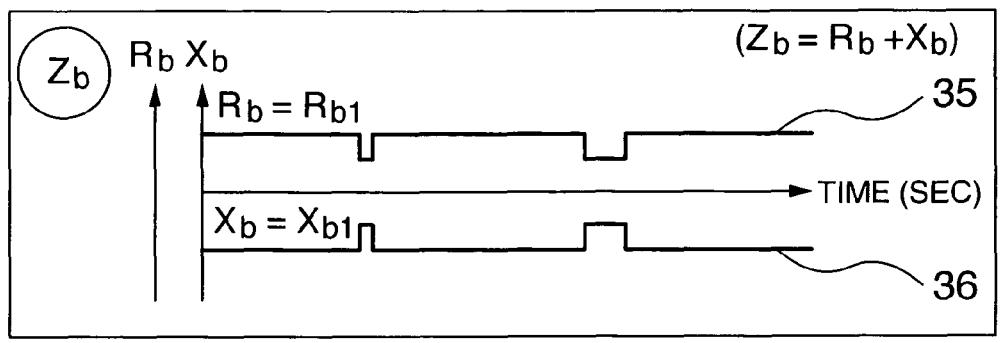
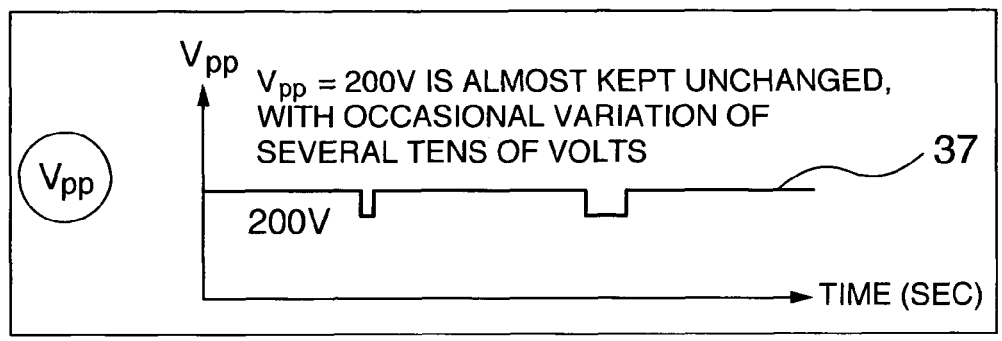
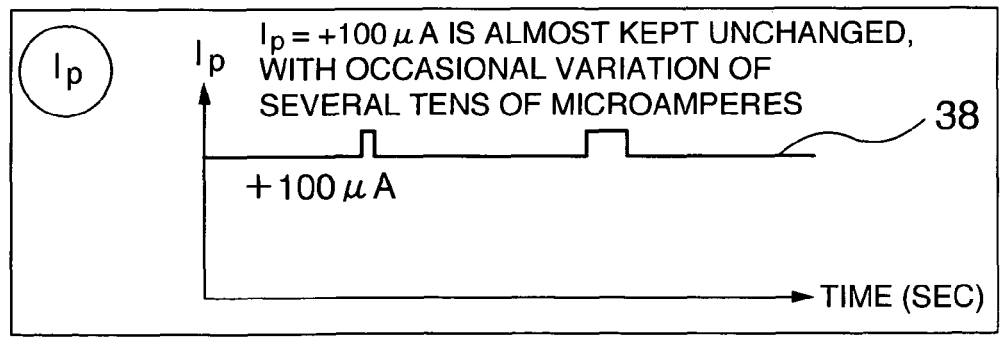

FIG. 7
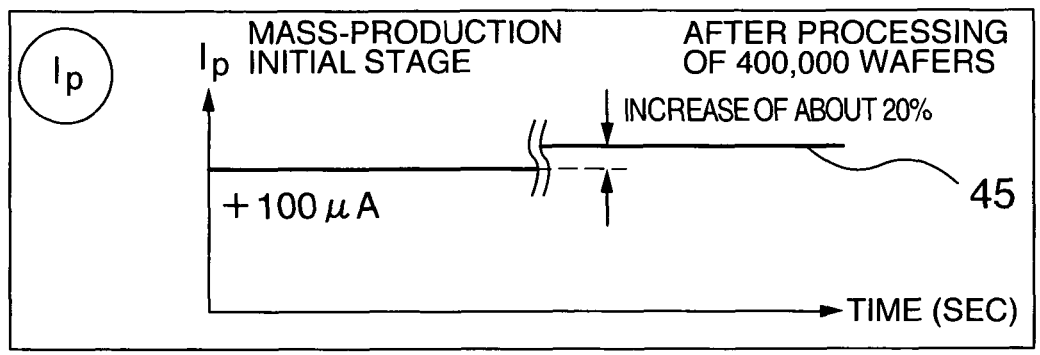
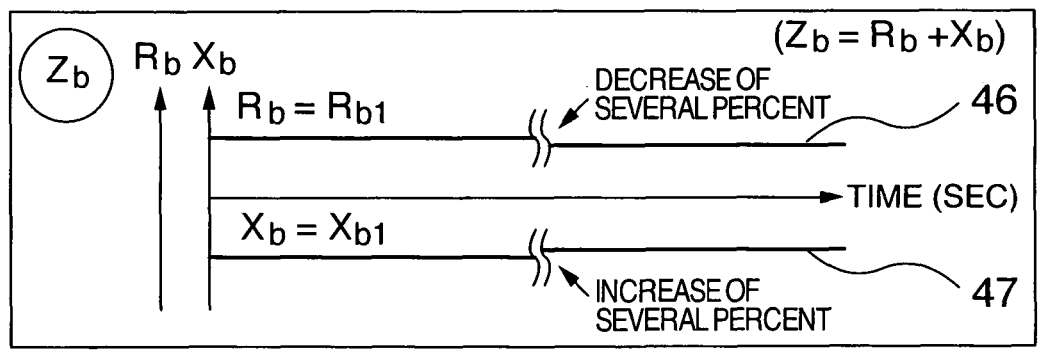
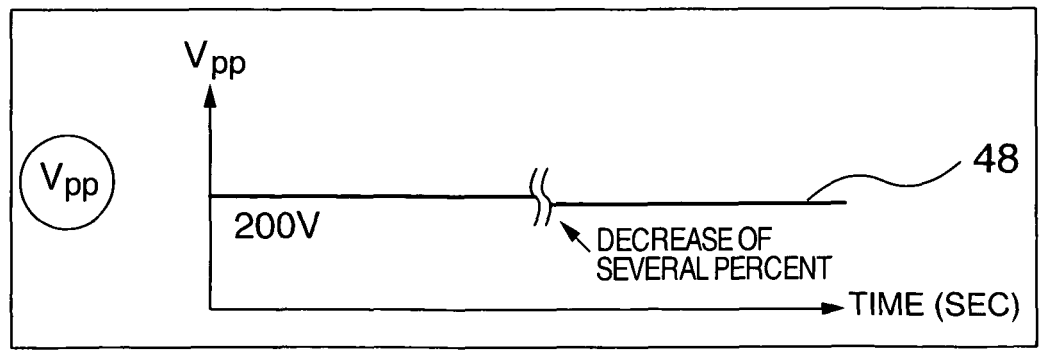

FIG. 10
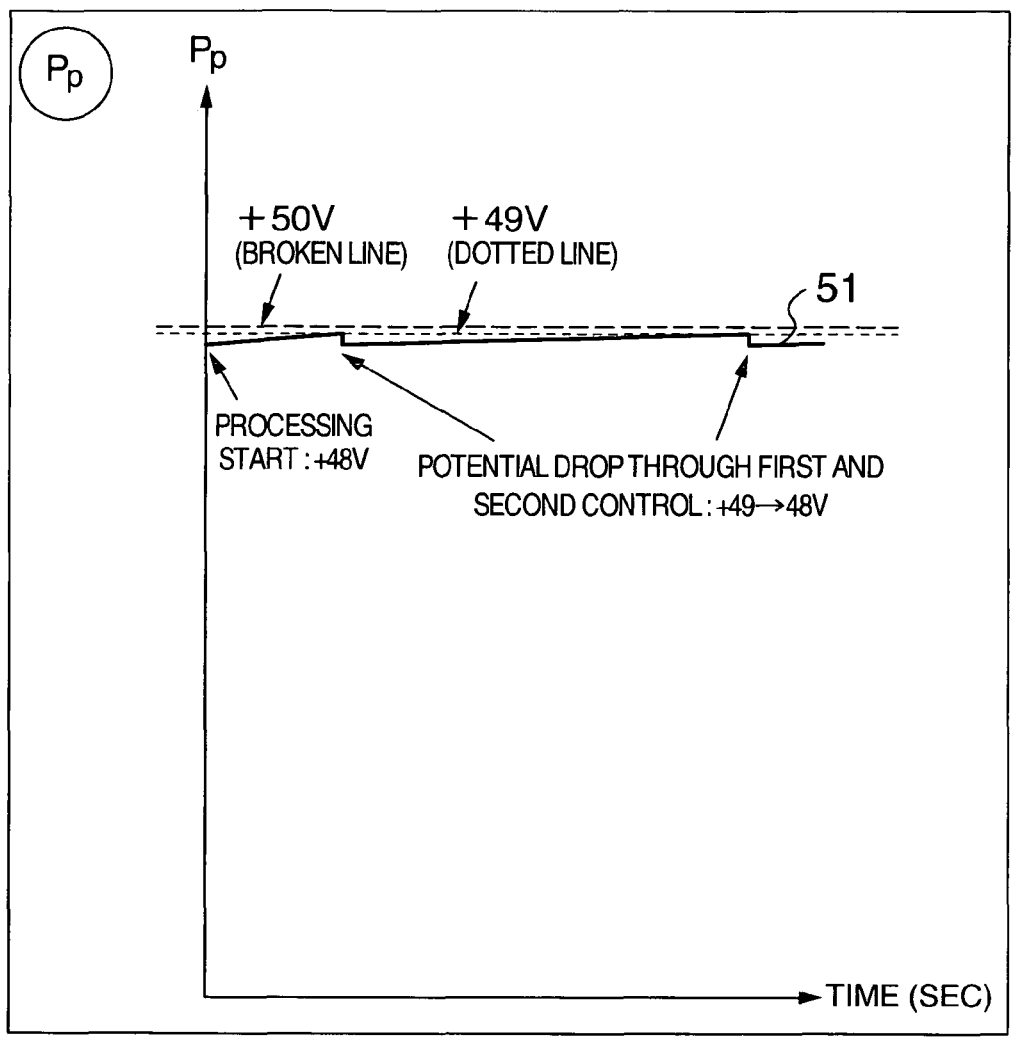
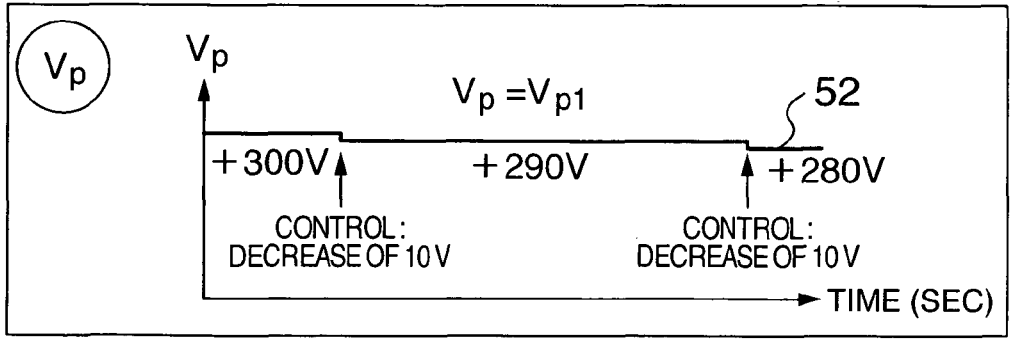

PLASMA PROCESSING APPARATUS

BACKGROUND OF THE INVENTION

The present invention relates to a plasma processing technique, and in particular, to a plasma processing technique to monitor a monitor value of a monitor attached to a plasma processing apparatus to thereby detect an abnormality of the apparatus in an early stage of the abnormality.

For plasma processing apparatuses used to produce semiconductor products, in association with fine manufacturing of devices, high integration thereof, variety of materials of the products; importance is attached not only to uniformity of processing and improvement of precision, but also to massproductivity such as long-term stability of processing characteristics and suppression of discrepancy of processing between a plurality of plasma processing apparatuses. Therefore, in one and the same chamber, it is required to keep the plasma characteristics fixed for a long period of time. Also when some worn parts are replaced at maintenance of the plasma processing apparatuses, the plasma characteristics are required to be kept unchanged. When a plurality of chambers are employed, it is required in the management thereof to detect fine characteristic difference between the chambers to correct the difference.

When a plasma etching apparatus is used for a long period of time, an inner wall of its chamber is worn or deposited substance is accumulated on the inner wall. This resultantly changes the process environments such as reaction on a surface of the inner wall of the chamber and an electric characteristic of the plasma. When the change in the process environments proceeds, the fine patterning characteristic is beyond its range of allowance at a certain point of time. For example, the gate dimension of a device is beyond the allowance range, and the produced Large Scale Integration (LSI) device is deteriorated in performance as a result. Furthermore, if the deposition of substance on the inner wall proceeds, the deposited substance peels off as dust particles from the inner wall and causes an etching defect.

On the other hand, wearing of parts such as the inner wall also causes abnormal discharge at a certain point of time to abruptly increase deteriorated substance, which possibly becomes a factor to fatally increase the failure ratio. In some cases, in addition to the simple wearing of the inner wall of the chamber, there occurs peeling of a coating film formed on the inner wall to enhance strength against the plasma. Or, breakdown of insulation possibly takes place in the coating film. If a part replaced at maintenance or its assembled state is defective, a change appears in the processing characteristics.

To avoid such an event in which processing characteristics are beyond the range of allowance, various measures have been taken in recent plasma processing apparatuses. For example, various monitor values such as an emission spectrum, a peak-to-peak voltage value Vpp of the bias waveform, and the behavior of the reflected wave are continuously monitored to thereby determine whether or not the mass-production can be continuously conducted. Or, new material having higher strength is used for the inner wall to prevent the wearing thereof. Additionally, development of techniques is underway, for example, a technique in which the processing is stopped before occurrence of the processing failure and a technique to elongate the processing time lapsed up to a point of time of occurrence of the processing failure.

However, in a case in which the condition of the plasma processing apparatus is monitored using various monitor values, even if a monitor value changes and a change of the condition relative to an associated normal condition is confirmed, the cause of the change cannot be determined in some cases. For example, it is not possible to determine a part having caused the change in the monitor value and the resultant condition of the apparatus associated with the change.

In such a case, unnecessary maintenance is inevitably carried out depending on the case. For example, the chamber is disassembled and is entirely cleaned or some parts not to be necessarily and inherently replaced are replaced to guarantee operation of the plasma processing apparatus. This lowers the availability ratio of the apparatus and increases the cost for worn parts. Only if parts causing changes in monitor values and/or the abnormality can be determined, it is possible to beforehand prepare associated parts to be replaced in the maintenance.

Therefore, in addition to an operation to simply monitor a fine change in the process environments in the chamber generating the plasma and a trifle difference between the plasma processing apparatuses, there is required an operation to classify and determine a part causing the detected change or abnormality and a condition of the apparatus associated with the change or abnormality. This makes it possible to beforehand predict parts to be replaced.

The known monitor values to be monitored to determine the state of the plasma processing apparatus include the reflected wave power of the plasma generating electromagnetic wave, the light emission spectrum of the generated plasma, the peak-to-peak value Vpp of the bias voltage waveform applied to the wafer, and the matching point of the matching device of the plasma generating power source or the bias applying power source. Description will now be given of a technique to monitor the process progress state by use of these monitor values, specifically, a technique to monitor a condition change in the plasma generating chamber.

JP-A-2003-282542 describes a technique of determining, in a plasma processing apparatus of a method of using one frequency for the high-frequency wave to generate plasma and the high-frequency wave to apply the bias voltage, presence or absence of an abnormality in the plasma processing by monitoring a high-frequency current applied from the side of a sample processing stage (referred to as "sample stage" hereunder) to thereby compare the current value of the current with a high-frequency current value in the normal state.

JP-A-2003-282545 describes a technique of determining, in a plasma processing apparatus of a method of using one frequency for the high-frequency wave to generate plasma and the high-frequency wave to apply the bias voltage, presence or absence of abnormal discharge in the chamber on the basis of a fact that a change on the side of the plasma as the object of control operation can be detected using a monitor voltage sense by a matching circuit on the side of the sample stage. However, in this technique, neither the kind of abnormality nor the position of occurrence thereof is determined.

SUMMARY OF THE INVENTION

In the plasma processing, if the processing is continuously performed without detecting the change having occurred in the processing characteristics and/or the abnormality, defective devices are continuously produced. To avoid such difficulty, it is required to continuously monitor the change or abnormality in the chamber for the plasma processing. If a change or an abnormality to be regarded as a trouble of the apparatus is detected, it is required to take measures, for example, to output a warning message to thereby stop the processing.

To restore in a short period of time the plasma processing apparatus in the abnormal state, it is required, at a state monitoring point of time before occurrence of the abnormal state, to beforehand determine positions (parts) at which occurrence of a change or an abnormality is predicted and the kind of the change or abnormality to thereby prepare, for example, parts to be replaced.

Many parts are disposed in the chamber such as (1) a window member to introduce a plasma generating high frequency wave, upper electrode parts, and a gas injection plate to introduce reactive processing gas which are disposed in an upper section of the chamber; (2) inner-wall parts or chamber blocks on the side sections of the chambers; (3) a sample stage arranged in the lower section of the chamber and a susceptor covering a periphery of the sample stage.

Therefore, it is required to determine what kind of condition change or abnormality has occurred or is going to occur in which one of the parts (or which one of the sub-parts) as a result of continuous plasma processing and to classify the events of the plasma processing apparatus associated with the condition change and abnormality.

It is therefore an object of the present invention, which has been devised to solve the problem, to provide a plasma processing technique in which a condition change occurred in the chamber or a position of occurrence of an abnormality therein is determined for classification thereof and which is capable of predicting a position (part) of occurrence of the condition change or the abnormality and the kind of the change or the abnormality.

To solve the above problem according to the present invention, there are provided measures to solve the above problem as below.

According to one feature of the present invention, there is provided a plasma processing apparatus including a chamber in which inner parts of an inner cylinder type with a protective coating thereon is disposed on an inner wall of the chamber; a sample stage disposed in the chamber, the sample stage including a wafer attracting electrode on a sample placing surface thereof, the electrode being insulated from the sample stage by an insulating film; a gas introducing module including a gas injection plate which disperses and introduces processing gas into the chamber; a plasma generating high-frequency wave power source for supplying high-frequency wave energy to the processing gas introduced into the chamber to thereby generate plasma; a bias applying high-frequency wave power supply for applying a high-frequency bias voltage to the sample stage; and a wafer attracting power source for applying a direct-current voltage to the wafer attracting electrode to attract an wafer, thereby conducting plasma processing for the sample placed on the sample stage using the plasma thus generated. The plasma processing apparatus further includes a wafer attracting current monitor for monitoring a current supplied from the wafer attracting power source, an impedance monitor on the plasma generating side for monitoring the impedance of the plasma viewed from the plasma generating high-frequency power source, and an impedance monitor on the bias applying side for monitoring impedance of the plasma viewed from the bias applying high-frequency power supply. According to monitor values measured by the monitors, the apparatus determines presence or absence of either one of abnormal discharge in the inner parts, deterioration in insulation of the sample stage insulating the wafer attracting electrode, and abnormal discharge in the gas injection plate.

Thanks to the configuration of the present invention, it is possible to determine a condition change occurring in the chamber or a position of occurrence of an abnormality therein and it is also possible to predict a position (part) of occurrence of the condition change or the abnormality and the kind of the change or the abnormality.

Other objects, features and advantages of the invention will become apparent from the following description of the embodiments of the invention taken in conjunction with the accompanying drawings.

BRIEF DESCRIPTION OF THE DRAWINGS

FIG. 4 is a diagram showing a change in the plasma potential Pp.

FIG. 5 is a diagram showing a change in the monitor values when an abnormality occurs in the vicinity of a sample stage 5 or a susceptor 20 covering a periphery of the sample stage 5.

FIG. 7 is a diagram showing changes in the monitor values from when the mass-production is started to when the number of processed wafers exceeds 400000.

FIG. 10 is a diagram showing changes in the plasma potential Pp and the wafer attracting power source voltage Vp in an operation in which control is conducted to reduce the voltage value Vp applied from the wafer attracting power source Vp to the sample stage when the plasma potential Pp increases.

DESCRIPTION OF THE EMBODIMENTS

Description will now be given of embodiments of the present invention by referring to the accompanying drawings.

First Embodiment

Figure 1:
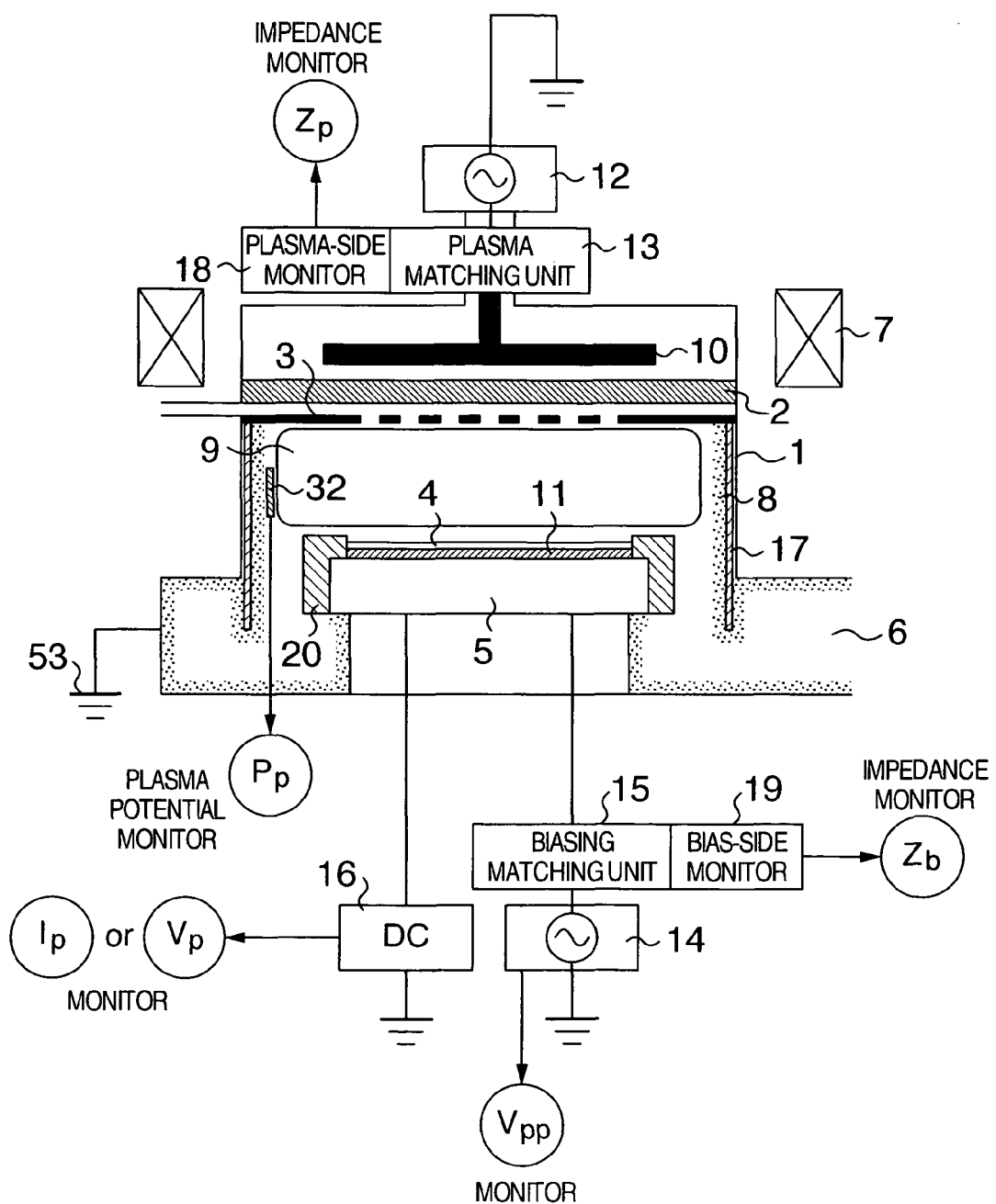
FIG. 1 is a diagram to explain a first embodiment of a plasma processing apparatus.

FIG. 1 is a diagram to explain a first embodiment of a plasma processing apparatus. In the example of FIG. 1, a plasma etching apparatus using electromagnetic waves in an Ultra-High Frequency (UHF) band is employed as the plasma processing apparatus.

In the upper section of a vacuum chamber 1 for plasma processing, a dielectric vacuum window 2 to introduce an electromagnetic wave in the UHF band to generate plasma and a dielectric gas injection plate 3 to introduce reactive processing gas are disposed. Reaction products resultant from the etching process are discharged from an outlet 6 in the lower section of the chamber 1. On a side-wall section inside the chamber 1, there are arranged cylindrical inner parts 17 including a base metal of aluminum and an inner wall protective coating 8 applied on a surface of the base metal using a dielectric material. A wafer (sample) 4 to be etched is placed on an electrostatic chuck constructed by disposing a wafer attracting coating film of a dielectric (high-resistance) material on a surface of the sample stage 5. The wafer 4 placed as above is attracted by electrostatic force due to an electric field supplied via the wafer attracting coating film 11.

By filling a gap between the wafer 4 and the film 11 with helium gas, heat transfer is secured between the wafer 4 and the film 11 on the upper surface of the sample stage 5. This enables effective control of the temperature of the wafer 4. The periphery of the sample stage 5 is covered with a susceptor 20 of a dielectric material.

The sample stage 5 is connected to a bias power supply 14 and a biasing matching unit 15 which are used to apply a high-frequency bias voltage to the wafer 4 and a wafer attracting power source 16 to attract the wafer 4 by electrostatic force.

A reactive gas is injected via the gas injection plate 3 into the chamber 1 while keeping the gas pressure typically at about 0.5 Pa to about 10 Pa. In this state, the magnetic field coil 7 applies a magnetic field to the chamber 1. In addition, the high-frequency power in the UHF band from the plasma generating power source 12 is emitted into the chamber 1 from an antenna 10 disposed outside (on the side of atmosphere) the plasma matching unit 13 and the vacuum window 2 to resultantly generate plasma 9 in the chamber 1. To the wafer 4 exposed to the plasma thus generated, the wafer attracting dc voltage and the high-frequency bias are applied to conduct the etching process.

In this situation, the impedance Zp of the plasma viewed from the plasma generating high-frequency power source (first high-frequency power source) is monitored by an impedance monitor 18 on the plasma generating side disposed on the plasma matching unit 13 or in the vicinity thereof. Also, the impedance Zb of the plasma viewed from the bias applying high-frequency power supply (second high-frequency power source) is monitored by an impedance monitor 19 on the bias applying side disposed on a biasing matching unit 15 or in the vicinity thereof. With the high-frequency wave applied from the bias power supply 14 to the sample stage 5, the peak-to-peak value Vpp of the high-frequency voltage is monitored by a peak-to-peak voltage monitor. The dc voltage Vp applied from the wafer attracting power source 16 to the sample stage 5 and the dc current (waver attracting current) Ip flowing when the voltage is thus applied are monitored respectively by a wafer attracting dc voltage monitor and a wafer attracting current monitor. By monitoring five values of Zp, Zb, Vpp, Vp, and Ip in this way, the apparatus monitors the change and the occurrence of an abnormality in the chamber 1.

When the mass-production is being normally carried out, the plasma impedance viewed from the plasma generating high-frequency power source during the etching discharge is expressed as $Zp1=Rp1+jXp1\Omega$, the plasma impedance viewed from the bias applying high-frequency power source during the etching discharge is $Zb1=Rb1+jXb1\Omega$, the peak-to-peak value of the high-frequency voltage with the bias applying high-frequency voltage applied to the sample stage is Vpp1 V, and the dc voltage and the dc current of the wafer attracting power source 16 are Vp1 and Ip1 A, respectively.

Figure 2:
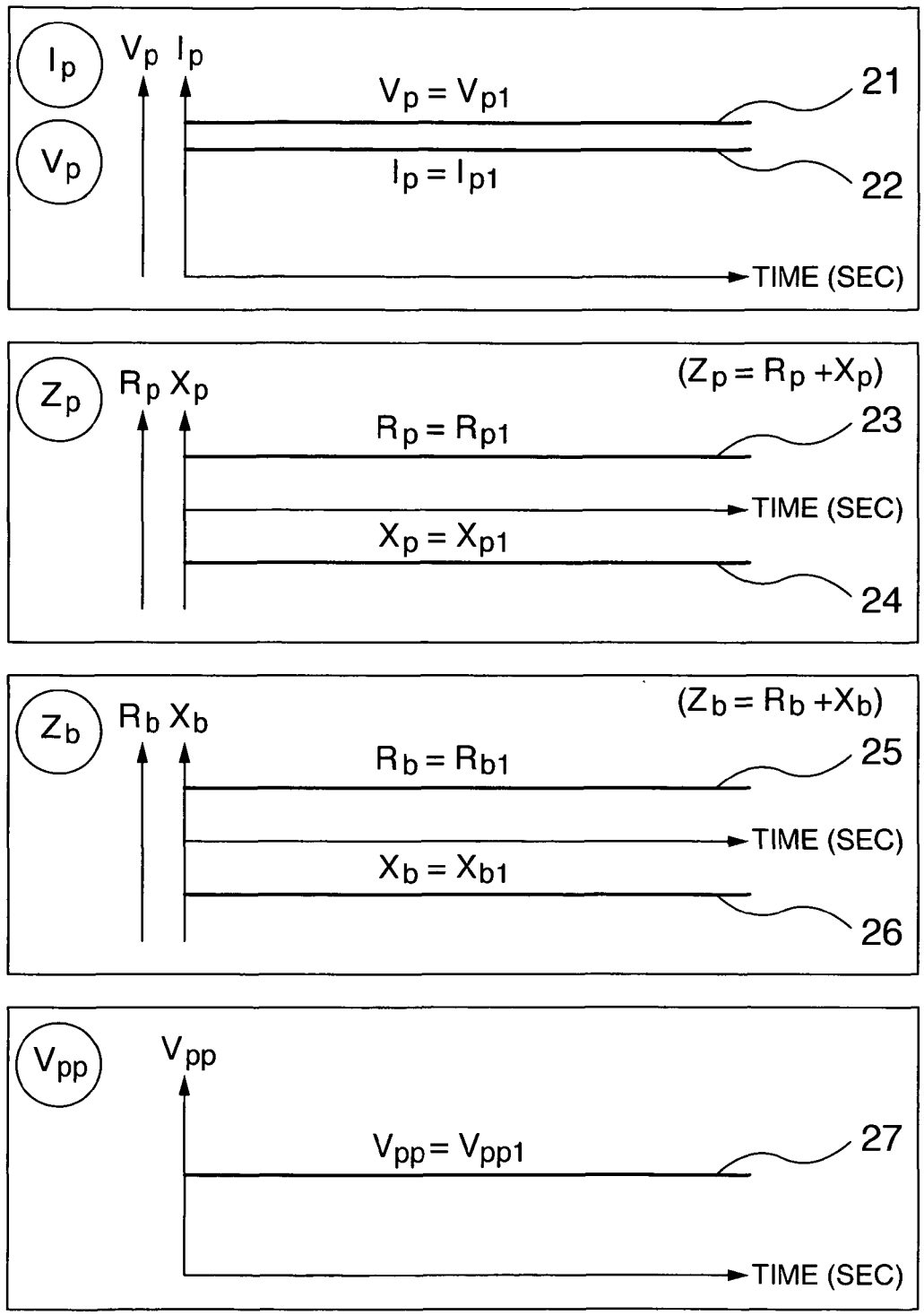
FIG. 2 is a diagram showing states of monitor values in a normal operation.

FIG. 2 shows a state of monitor values in the normal operation described above. The dc voltage 21 and the dc current 22 of the wafer attracting power source are shown in one graph. In the graph of the impedance Zp of the plasma viewed from the plasma generating high-frequency power source, the impedance Zp of a complex number is expressed by a real part 23 of Zp and an imaginary part 24 thereof. In the graph of the impedance Zb of the plasma viewed from the bias applying high-frequency power source, the impedance Zb of a complex number is expressed by a real part 25 of Zb and an imaginary part 26 thereof. The graph of Vpp shows a peak-to-peak voltage 27 of the bias applying high-frequency voltage. The actual etching period of time is 60 seconds. During the normal mass-production, the condition in which the fixed values are kept unchanged continues for 60 seconds as shown in the graphs.

The values of Zp, Zb, Vpp, Vp, and Ip are continuously monitored while the mass-production is being carried out. In the state of the mass-production, there are alternately conducted "cleaning discharge" in which the discharge is conducted in absence of a wafer to beforehand clean the inside of the chamber and the surface of the dielectric wafer attracting coating film 11 arranged on the upper surface of the sample stage 5 and "etching discharge" in which the discharge is conducted in presence of a wafer for the etching processing thereof. If a change or an abnormality occurs in the chamber 1, since the cleaning discharge and the etching discharge are conducted in the same chamber 1, there appears a change in the monitor values in both cases. Although the monitor signals slightly vary in intensity thereof depending on the difference between the conditions respectively of the cleaning discharge and the etching discharge, the ways in which the changes appear are similar to each other. Therefore, in the description of the embodiments of the present invention, data items of the monitor values in the etching discharge will be used as typical data items.

The wafer attracting coating film 11 of a dielectric material disposed on the upper surface of the sample stage 5 is made of a ceramic material mixed with quite a small amount of a conductive element. Although the film 11 is basically a dielectric item, a current slightly flows therethrough and hence can be regarded as a high-resistance material. Specific current values are as follows. When the wafer attracting power source 16 applies an attracting voltage of $Vp=Vp1=+300$ V, the current value of the current flowing through the wafer 4 is not zero, but is $Ip=Ip1=+100$ µA during the etching discharge.

When the mass-production is continuously conducted for 10000 wafers, although no change is observed in Zp, Zb, and Vpp, the value of the dc current 28 of the wafer attracting power source 16 cannot be kept at a fixed value of +100 µA.

Figure 3:
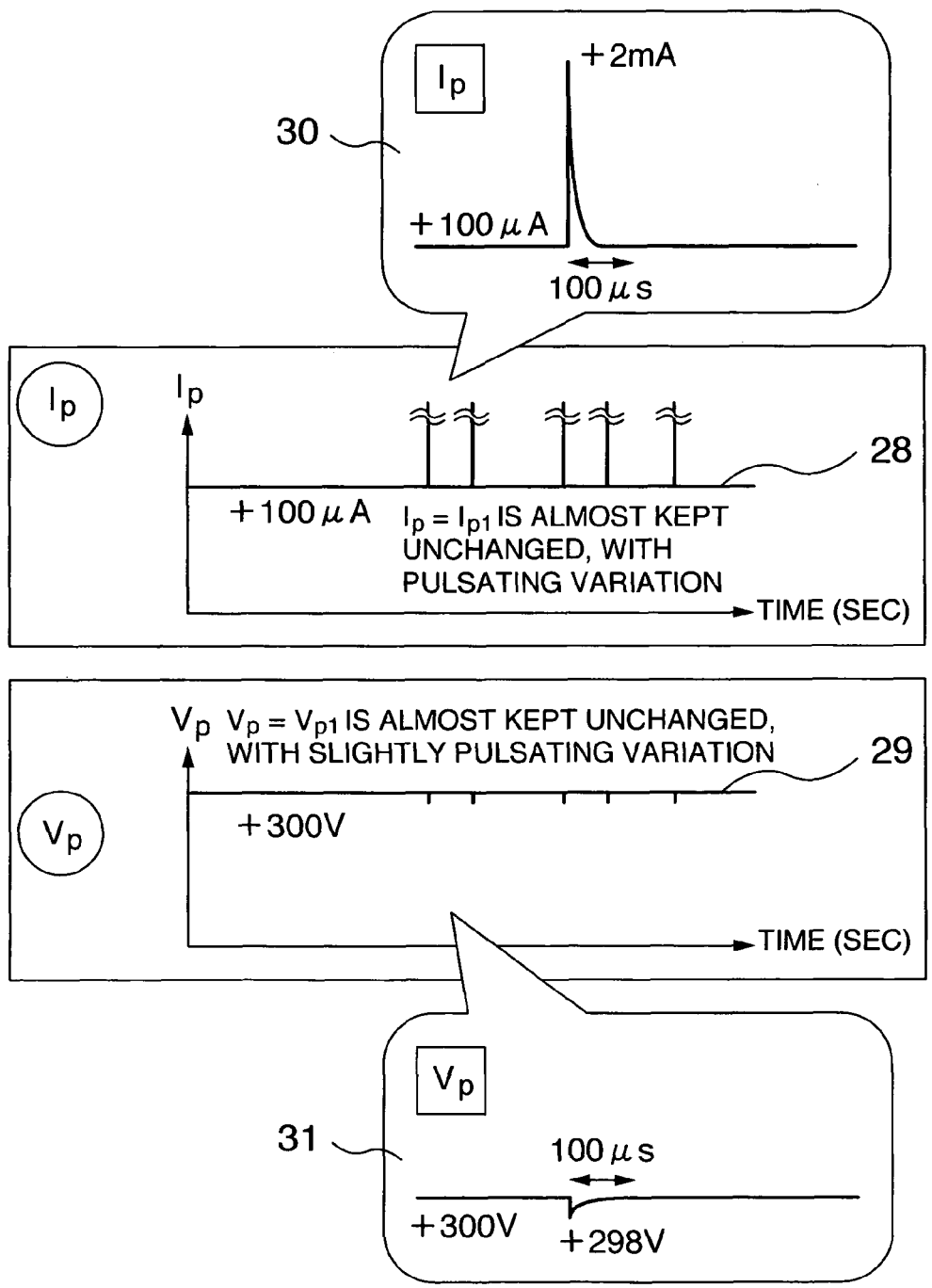
FIG. 3 is a diagram to explain in detail the change with respect to time of a direct current (dc) outputted from a wafer attracting power source 16.

FIG. 3 is a diagram to explain in detail the change with respect to time of the direct current from the wafer attracting power source 16. As can be seen from FIG. 3, although +100 µA is kept unchanged for a while, there appears a monitor signal of which the current value increases up to several milliampere in a pulsating way at an interval of several seconds. The pulsating (pulse-like) variation is a phenomenon in a time scale of the pulse width equal to or less than 100 microseconds (µs).

On the other hand, no considerable change appears in Zp, Zb, and Vpp. In addition to the change in the direct current 28, i.e., Ip, FIG. 3 also shows the change in the dc voltage 29, i.e., Vp. Since the wafer attracting power source 16 is applying the dc voltage to the sample stage 5, when a pulsating current flows from the power source 16, the dc voltage is associatively to change in a pulsating way if the power source 11 is of small capacity. Details of the pulsating variations in the current and the voltage are shown in a detailed direct current 30 and a detailed dc voltage 31.

At timing of the pulsating variation in the detailed direct current 30, a slight variation also appears in the detailed dc voltage 31. It can be considered that the variation in the detailed dc voltage 31 is observed since the test is conducted using a power source of small current capacity at a milliampere (mA) level. To confirm the event, the power source is replaced by a power source of a large current capacity at a 100 mA level. There rarely appears a variation in the detailed dc voltage 31. Consequently, it is known that the pulsating variation in the embodiment appears in the dc current 28, i.e., Ip and also appears in the dc voltage 29, i.e., Vp due to the voltage drop if the power source capacity is small. Since the pulsating variations in Ip and Vp are recognized by detecting an inherently one and the same variation, it is only necessary to detect the variation using the direct current Ip for which a clear monitor signal can be observed regardless of the power source capacity. Even in the initial stage in which the variation is small, the variation can be detected with high sensitivity. Only when the abnormality becomes still worse and Ip increases to the limit of the power source current capacity, Vp can be first detected. Therefore, the variation is to be detected using Ip.

In the situation, since there does not appear any considerable change in the impedance Zp viewed from the plasma generating high-frequency wave, it can be determined that the abnormality has occurred in other than the dielectric vacuum window 2 disposed in the upper section of the chamber to introduce the plasma generating power and the dielectric gas injection plate 3 to introduce the reactive processing gas. Moreover, there does not appear any considerable change in the impedance Zb viewed from the bias applying high-frequency wave and the peak-to-peak value Vpp of the high-frequency voltage when the bias applying power source 14 applies the high-frequency wave to the sample stage 5. Therefore, it can be determined that the abnormality has occurred in other than the vicinity of the sample stage disposed in the lower section of the chamber and the susceptor covering the periphery of the sample stage. The pulsating electric variation appears although any abnormal discharge takes place in the vicinity of the plasma generating section and the sample stage. Therefore, it can be determined that this is caused by a monitor signal appearing as below. Breakdown of insulation occurs in the inner wall coating 8 on the surface of the cylindrical inner parts 17 disposed in the chamber on the side section thereof and electric charge abruptly flows in the base metal of the chamber, which results in the monitor signal. To remove the abnormality according to the determination, the inner parts 17 are replaced by new parts including a new inner wall protective coating 8. As a result, the signal with the pulsating variation in Ip disappears and the normal state is restored. It is hence confirmed that when the pulsating variation appears in Ip and no variation appears in Zp, Zb, and Vpp, the state of abnormality is appropriately classified as follows. That is, the insulation breakdown occurs in the inner wall coating 8 on the surface of the cylindrical inner parts 17 disposed in the chamber on the side section thereof.

It has been recognized that as the mass-production is continuously conducted thereafter with the etching condition kept unchanged, a similar pulsating variation appears in Ip almost similarly in the processing of 10000 wafers. Moreover, when the cylindrical inner parts 17 are replaced as above, the normal state is also restored.

The abnormality due to the insulation breakdown in the inner wall protective coating 8 on the surface of the inner parts 17 is a kind of abnormal arc discharge. If the abnormality having occurred is not detected and the mass-production is continuously conducted, the current value of the current flowing at puncture of the insulation also increases. If the processing is further continued, the material of the coating 8 is dispersed up to the wafer 4. The dispersed materials become dust particles to cause contamination, which results in the etching failure.

However, in the present embodiment, the pulsating variation in Ip appearing after the processing of about ten thousand wafers is detected to replace the cylindrical inner parts 17 in the initial stage of the pulsating variation. Therefore, the processing can be continuously conducted in the normal state without causing the failure in the device manufacturing process.

In this connection, after the inner parts are replaced, the state of the inner wall protective coating 8 on the surface of the used inner parts 17 is observed by a microscope to resultantly detect many indications of the insulation breakdown particularly in edge sections of the coating 8. To directly confirm the phenomenon of the insulation breakdown in a portion of the coating 8, there is confirmed, in addition to the direct current 28 and the dc voltage 29 of the wafer attracting power source 16, the plasma potential Pp, i.e., a voltage applied to the inner wall protective coating 8, using a plasma potential probe 32 shown in FIG. 1.

FIG. 4 shows a change in the plasma potential Pp. The plasma potential 33 in the vicinity of the coating 8 is measured. With the potential of +50 V set as a reference value, there is observed a phenomenon in which the potential instantaneously drops down to about +3 V at timing synchronized with the pulsating variation. The potential is restored in a restoration period of time more than that of the direct current 28 and that of the dc voltage 29 shown in FIG. 2. As shown in a graph of detail plasma potential 34, the potential waveform is restored to +50 V in a period of time at the one-second level. It can be considered that the waveform indicates a phenomenon in which insulation breakdown occurs in the inner wall protective coating 8 on the surface of the cylindrical inner parts 17 and a current flows to ground 53 and the plasma potential 33 abruptly drops and is thereafter restored to the original value.

As above, the insulation breakdown of the coating 8 on the surface of the inner parts 17 can be monitored by the pulsating variation in the direct current 28 of the wafer attracting power source 16. Also, it has been recognized that the similar variation can be confirmed by the dc voltage 29 or the plasma potential 33. In the above situation, no variation is detected in the impedance Zp of the plasma viewed from the plasma generating power source, the impedance Zb of the plasma viewed from the bias applying power supply, and the peak-to-peak value Vpp of the bias applying high-frequency voltage which are being simultaneously monitored. Therefore, it can be determined that the variation or the abnormality takes place in the cylindrical inner parts 17.

In conjunction with the embodiment, description has been given of an example in which the cylindrical inner parts 17 are disposed on the side wall inside the chamber 1. However, in a plasma processing apparatus in which the cylindrical inner parts 17 and the chamber 1 are configured in one unit, there may be employed a measure to replace the chamber 1 depending on cases when the insulation breakdown occurs in the inner wall protective coating 8 made of a dielectric material. It is assumed in the embodiment that the chamber 1 is constructed in the contour of a cylinder and hence the inner parts 17 are formed also in the cylindrical contour. However, the present invention is applicable even if the inner surface of the chamber is not in the cylindrical contour. That is, the present invention is applicable only if the following points are almost the same as for the embodiment. That is, the inner surface protective coating 8 is arranged in the chamber and parts of which base metal is grounded are disposed in the chamber. In other words, even if the objective parts may be, for example, parts on the bottom surface to enclose the bottom section, a shielding plate to prevent undesired downward diffusion of plasma and to prevent upward dispersion of contamination and dust particles, or a cover or the like disposed over the lower section of the sample stage to conceal the lower section lower than the susceptor of the sample stage, the breakdown of the inner wall protective coating 8 can be detected to issue a warning message for the requirement of maintenance.

Second Embodiment

In conjunction with the second embodiment, description will be given of an example in which a abnormality occurs in the vicinity of the sample stage 5 disposed in the lower section of the chamber 1 or the susceptor 20 covering the periphery of the sample stage in the plasma processing apparatus shown in FIG. 1.

The mass-production is carried out while monitoring four values of Zp, Zb, Vpp, and Ip in the plasma processing apparatus of FIG. 1. The condition for the mass-production includes "cleaning condition" and "etching condition" as in the first embodiment. During the operation to monitor the four monitor values, each time about ten thousand wafers are processed, the pulsating variation appears in Ip and the insulation breakdown takes place in the inner wall protective coating 8 on the surface of the cylindrical inner parts 17 as described in conjunction with the first embodiment. To cope with the difficulty, the mass-production is continuously carried out by periodically replacing the inner parts 17. When the 100000th wafer is processed in total and the inner parts 17 are replaced with new inner parts during the maintenance to attempt to continue the mass-production, there occurs a monitor value variation different from those appearing in the first embodiment.

FIG. 5 shows the monitor value variation (at occurrence of an abnormality in the vicinity of the sample stage 5 disposed in the lower section of the chamber 1 or the susceptor 20 covering the periphery of the sample stage). While no variation appears in the monitor value Zp, a variation appears in three monitor values Zb, Vpp, and Ip as shown in FIG. 5. The variation time width is longer in this case than the case of the first embodiment, that is, about 0.1 second to about several seconds for the three monitor values: Zb (the real part 35 and the imaginary part 36 of Zb), Vpp (the peak-to-peak voltage 37), and Ip (the direct current 38), which are synchronized with each other.

Distinct from the first embodiment, the second embodiment has an aspect that the variation occurs not only in Ip but also in Zb and Vpp. In the first embodiment, the waveform is associated with the insulation breakdown of the coating 8 on the surface of the inner parts 17. This leads to an aspect that the pulsating variation of the waveform instantaneously occurs and then the waveform restores to the original state according to a time constant. However, by visually checking the waveform of the second embodiment in detail, it is recognized an aspect that the signal is stable in a different value for a fixed period of time about 0.1 second to about several seconds and thereafter returns to the original value (i.e., the pulsating variation becomes a rectangular waveform variation).

In the situation, no remarkable variation appears in the impedance Zp viewed from the plasma generating power source. Therefore, it can be determined that the abnormality has occurred in the vacuum window 2 disposed in the upper section of the chamber 1 to introduce the plasma generating power or in the gas injection plate 3 disposed in the upper section of the chamber 1 to introduce the reactive processing gas. On the other hand, the impedance Zb viewed from the bias applying power supply varies and the peak-to-peak voltage value Vpp of the bias applying high-frequency wave also varies.

On the basis of the above variations, it is determined that the waveform is a monitor signal indicating abnormal discharge in the susceptor 20 covering the sample stage 5 disposed in the lower section of the chamber and the periphery of the sample stage 5 or in an space zone such as a structure including projections and depressions and a gap zone in the vicinity of the susceptor 20. According to the determination, to remove the abnormality, a check is made by removing the susceptor 20 covering the periphery of the sample stage 5. As a result, it is detected that the susceptor 20 is damaged or defected at one position thereof on the side near the wafer probably due to impact applied thereto by mistake during the maintenance. Also, it is detected that in quite a near position thereof, the wafer attracting film 11 disposed on the upper surface of the sample stage 5 is peeled off or seems to have been broken. Consequently, it is determined that the variation in the three monitor values Ip, Zb, and Vpp is caused as follows. A gap appears due to defects of the susceptor 20 and the wafer attracting film 11 on the upper surface of the sample stage 5, and discharge occasionally enters the gap or discharge occasionally takes place therein. To remove the abnormality according to the determination, the items relating to the problem, that is, the susceptor 20 and parts of the sample stage 5 with the wafer attracting film 11 arranged on the upper surface thereof are replaced with new associated items. As a result, the variations observed in the signals Ip, Zb, and Vpp disappear and the normal state is restored. It is hence confirmed that in a case in which the three monitor values Ip, Zb, and Vpp vary and the monitor value Zp is kept unchanged, the abnormality can be appropriately classified such that the abnormality has occurred in the vicinity of the sample stage 5 disposed in the lower section of the chamber 1 or the susceptor 20 covering the periphery of the sample stage 5. Thereafter, without changing the etching condition, the mass-production is continuously conducted by replacing the inner parts 17 with new inner parts each time ten thousand wafers are processed as described in conjunction with the first embodiment. The maintenance is carefully carried out not to damage the susceptor 20 and the wafer attracting film 11 on the upper surface of the sample stage 5. Therefore, even when the mass-production is conducted up to 200000 wafers, there does not occurs an event in which the monitor values of Ip, Zb, and Vpp change.

In conjunction with the second embodiment, description has been given of an example in which the wafer attracting film 11 on the upper surface of the sample stage 5 is damaged or parts are damaged in the vicinity of the susceptor 20 covering the periphery of the sample stage 5. However, for the electrodes of the plasma processing apparatus, structures other than the susceptor 20 are employed, that is, structures such as wafer lifting pins to transport the wafer, piping (holes) to supply helium gas to a rear surface of the wafer to thereby cool the wafer, and an embedded heater structure. When parts of these structures are built in the sample stage 5 to which the high-frequency bias and the direct current are applied, the present invention is also applicable if such parts of the structures are worn and damaged to cause abnormal discharge in the vicinity of the sample stage 5.

In a case of a plasma processing apparatus in which the high-frequency bias is not applied, the signals Zb and Vpp are not obtained, and hence the variation can be confirmed only for Ip. In this situation, according to a feature of the waveform (impulse-shaped or rectangular pulses), it is possible to determine the insulation breakdown in the inner wall protective coating 8 on the surface of the cylindrical inner parts 17 or the abnormality in the vicinity of the sample stage 5 or the susceptor 20 covering the periphery thereof.

Third Embodiment

In conjunction with the third embodiment, description will be given of an example in which an abnormality occurs in the plasma processing apparatus of FIG. 1 in the vicinity of the vacuum window 2 disposed in the upper section of the chamber 1 to introduce the plasma generating power and the gas injection plate 3 disposed in the upper section of the chamber 1 to introduce the reactive processing gas.

The mass-production is carried out in the plasma processing apparatus of FIG. 1 while monitoring four values of Zp, Zb, Vpp, and Ip. The condition for the mass-production includes "cleaning condition" and "etching condition" as in the first embodiment. In the state shown in the second embodiment, the mass-production is continuously conducted. The four monitor values are monitored as above also after 200000 wafers are processed. The pulsating variation appears in Ip each time about ten thousand wafers are processed as described in conjunction with the first and second embodiments. To cope with the difficulty, the mass-production is continuously carried out by periodically replacing the inner parts 17 with new parts. When 300000 wafers are processed in total, the inner parts 17 are replaced with new inner parts in the maintenance, and then the mass-production is further conducted up to the 305000th wafer. There occurs a monitor value variation different from those described for the first and second embodiments.

Figure 6:
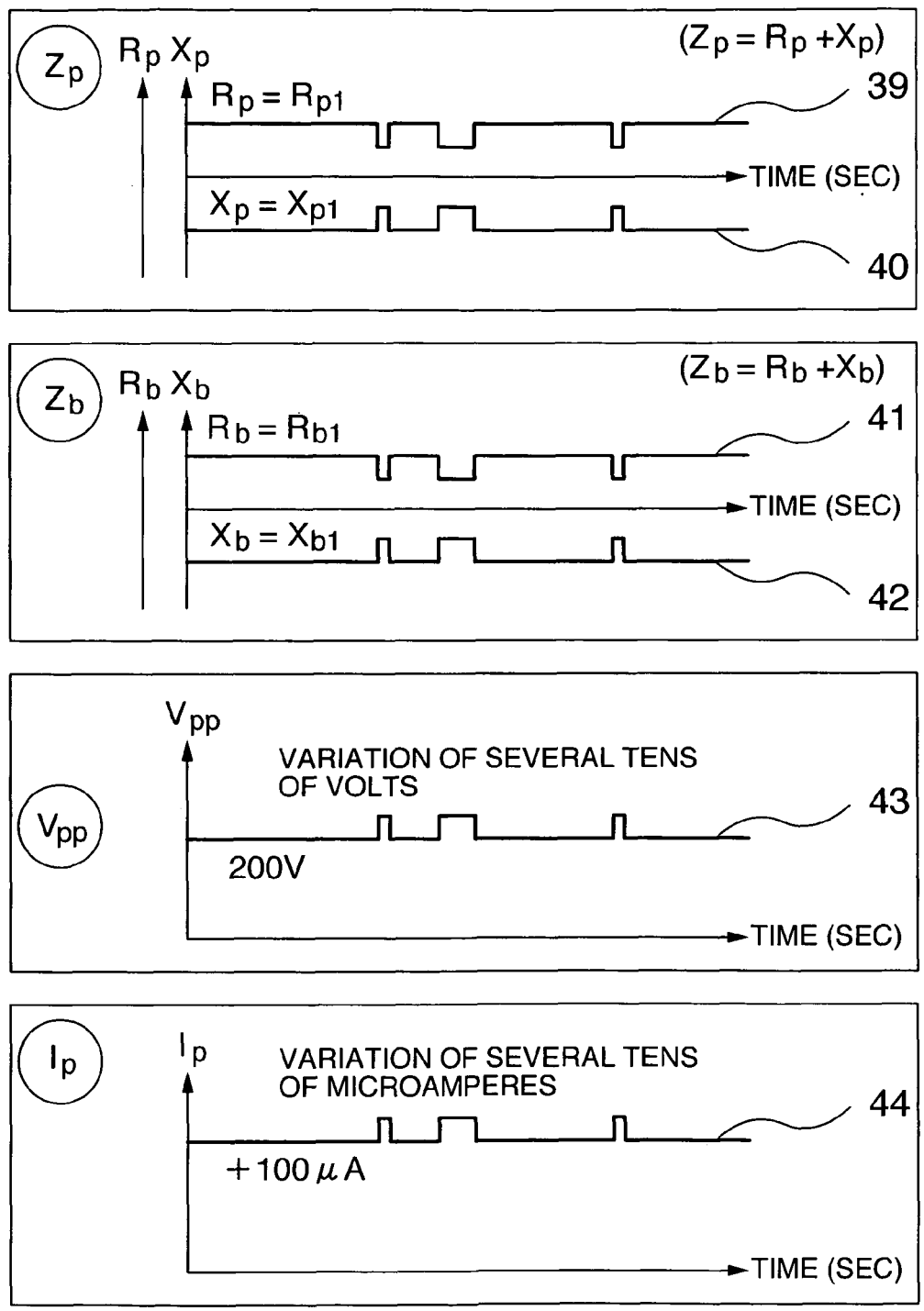
FIG. 6 is a diagram showing monitor values when the mass-production is continuously conducted up to the 305000th wafer while periodically replacing inner cylindrical inner parts 17.

FIG. 6 graphically shows monitor values when the mass-production is continuously carried out up to the 305000th wafer while periodically replacing the inner cylindrical inner parts 17.

As shown in FIG. 6, a variation appears in the four monitor values Zp, Zb, Vpp, and Ip. The variation time width is about 0.1 second to about several seconds for the four monitor values: Zp (the real part 39 and the imaginary part 40 of Zp), Zb (the real part 41 and the imaginary part 42 of Zb), Vpp (the peak-to-peak voltage 43), and Ip (the direct current 44), which are synchronized with each other.

In this situation, since a variation appears also in the impedance Zp viewed from the plasma generating power source, it can be determined that the abnormality has occurred in the vicinity of the vacuum window 2 disposed in the upper section of the chamber 1 to introduce the plasma generating power or the gas injection plate 3 disposed in the upper section of the chamber 1 to introduce the reactive processing gas. In the gap between the vacuum window 2 and the gas injection plate 3 and at positions of many pinholes disposed in the gas injection plate 3 to discharge gas, the pressure in the chamber 1 of the plasma processing apparatus, which ranges typically from 0.5 Pa to 10 Pa, is increased to a value about 100 times to about 1000 times the typical pressure. As a result of use of the apparatus for a long period of time, if the gap between the vacuum window 2 and the gas injection plate 3 becomes wider due to erosion by the etching reactive gas or the pinholes of the gas injection plate 3 to discharge gas are enlarged due to such erosion, the electric discharge likely occurs at such positions. For confirmation, a check is made by removing the vacuum window 2 and the gas injection plate 3 from the apparatus to resultantly detect that many pinholes for gas injection are etched and are enlarged. Particularly, several pinholes are more widely enlarged than the others. Indications of discharge are recognized in such pinholes. To remove the abnormality, the vacuum window 2 and the gas injection plate 3 are replaced with a new gas injection plate associated therewith. The variations in the four monitor values Ip, Zp, Zb, and Vpp disappear and the normal state is restored.

It can be considered that the variations in the monitor values other than Zp are caused by a variation in the density and the distribution of the plasma under the influence of the abnormal discharge taking place in the gap between the vacuum window 2 and the gas injection plate 3 and in the pinholes disposed in the gas injection plate 3 to inject gas. That is, the variations occur in the plasma density and distribution, and then the plasma potential also varies in association with the variations in the plasma density and distribution. This resultantly varies the monitor value Ip.

Therefore, it is confirmed that in a case in which a variation is detected in the four monitor values Ip, Zp, Zb, and Vpp, the abnormality can be appropriately classified such that the abnormal discharge has occurred in the vacuum window 2 in the upper section of the chamber to introduce the plasma generating power or the gas injection plate 3 disposed in the upper section of the chamber to introduce the reactive processing gas. Thereafter, with the etching condition kept unchanged, the mass-production is continuously conducted by replacing the inner parts 17 with new inner parts each time ten thousand wafers are processed as described for the first embodiment. Since the vacuum window 2 and the gas injection plate 3 are quite slowly eroded, even when the mass-production is continuously carried out up to 400000 wafers, there does not occurs the event in which the four monitor values of Ip, Zp, Zb, and Vpp change at the same time.

In the third embodiment, the vacuum window 2 arranged in the upper section of the chamber 1 to introduce the plasma generating power and the gas injection plate 3 disposed in the upper section of the chamber 1 to introduce the reactive processing gas are made of, for example, quartz or alumina ceramic. The vacuum window 2 and the gas injection plate 3 transmit electromagnetic waves therethrough. It can be hence considered that since the abnormal discharge occurs at a position through which electromagnetic waves transmit, an abnormal signal remarkably appears in the impedance Zp viewed from the electromagnetic waves. In addition to the configuration of the plasma processing apparatus in which the plasma generating power is introduced through quartz or alumina ceramic, there also exists a configuration the plasma processing apparatus in which an upper electrode made of a conductive substance (e.g., metal, carbon, or silicon) is directly inserted in the chamber from a position in an upper section thereof. However, for example, also in a plasma processing apparatus of parallel plate type in which the upper electrode is directly inserted in the chamber, the variation in the discharge state due to a variation in the state of the vicinity of the upper electrode and/or due to an influence thereof appears in the impedance Zp viewed from the plasma generating electromagnetic wave. Therefore, the present invention is also applicable to the configuration of the plasma processing apparatus.

Fourth Embodiment

Description will now be given of the fourth embodiment with reference to another example in which an abnormality occurs in the vicinity of the sample stage 5 disposed in the lower section of the chamber 1. In the example, the film thickness or the quality of the wafer attracting film 11 arranged on the upper surface of the sample stage 5 varies or the film thickness and the film quality differ from the standard values thereof, for example, new parts replaced as above are defective.

In the state shown in the second embodiment, the mass-production is continuously conducted in the plasma processing apparatus shown in FIG. 1 while monitoring the four monitor values Zp, Zb, Vpp, and Ip. The processing condition includes "cleaning condition" and "etching condition" as in the first embodiment.

The mass-production is continuously conducted in the condition shown in the third embodiment. Also after 400000 wafers are processed in total, the mass-production is continuously carried out by replacing the inner parts 17 with new parts each time ten thousand wafers are processed as described above. In this situation, the pulsating variation described in conjunction with the first embodiment does not appear in Ip.

FIG. 7 graphically shows variations in monitor values when the mass-production is continuously conducted up to 400000 wafers in total. Although no pulsating variation appears in the monitor value Ip as indicated by a direct current 45, the absolute value thereof increases about 20% relative to the absolute value immediately after the mass-production is started, i.e., Ip=Ip1=+100 µA. In this situation, while Ip increases about 20%, no voltage drop appears in Vp. The value of Vp is +300 V as in the ordinary state since the wafer attracting power source 16 has a sufficient capacity.

On the other hand, no variation appears in the impedance Zp viewed from the plasma generating power source. In the impedance Zb=Rb+jXb, the real part Rb decreases several percent and the imaginary part Xb increases several percent as indicated by a real part 46 and an imaginary part 47 in FIG. 7. The peak-to-peak voltage value Vpp of the bias applying high-frequency wave applied to the sample stage 5 decreases several percent as indicated by a peak-to-peak voltage 48 in FIG. 7.

In this situation, there has not occurred a discharge unstable phenomenon such as a pulsating variation in the discharge state and hunting triggered by the variation in the plasma matching unit 13 and/or the biasing matching unit 14. Therefore, the mass-production can be continuously conducted. Although Ip increases about 20%, the variation is small in the real part Rb and the imaginary part Xb of Zb=Rb+jXb and the peak-to-peak voltage value Vpp of the bias applying high-frequency wave. For the etching characteristics in this situation, there does not appear any remarkable variation beyond an allowance range in the etching rate and the micromachined contour.

Since the pulsating variation does not appear in the monitor values, it cannot be considered that the plasma processing apparatus is in a condition in which the insulation breakdown occurs in the inner wall protective coating 8 and the abnormal discharge occurs in the vicinity of the vacuum window 2 and the gas injection plate 3. In the plasma processing apparatus, the cylindrical inner parts 17 are replaced with new inner parts when the 400000th wafer is processed as described above. Therefore, it is determined that the 20% increase in Ip thus detected is caused by the variations in the film thickness and the film quality of the wafer attracting film 11 disposed on the upper surface of the sample stage 5. Specifically, the increase takes place because the film becomes thinner or the film quality is changed to resultantly reduce the resistance thereof.

In the description of the pulsating variation in the monitor values indicating an abnormality for the embodiments up to the third embodiment shown in FIG. 6, the relationship between the aspects of the variation and the abnormality in the chamber 1 has been clarified. However, the phenomenon in which the Ip monitor value changes without the pulsating variation as in the third embodiment has not been sufficiently recognized. Therefore, a check is made for history data from when the mass-production is started to when the number of wafers processed in the mass-production exceeds 400000 in total.

Figure 8:
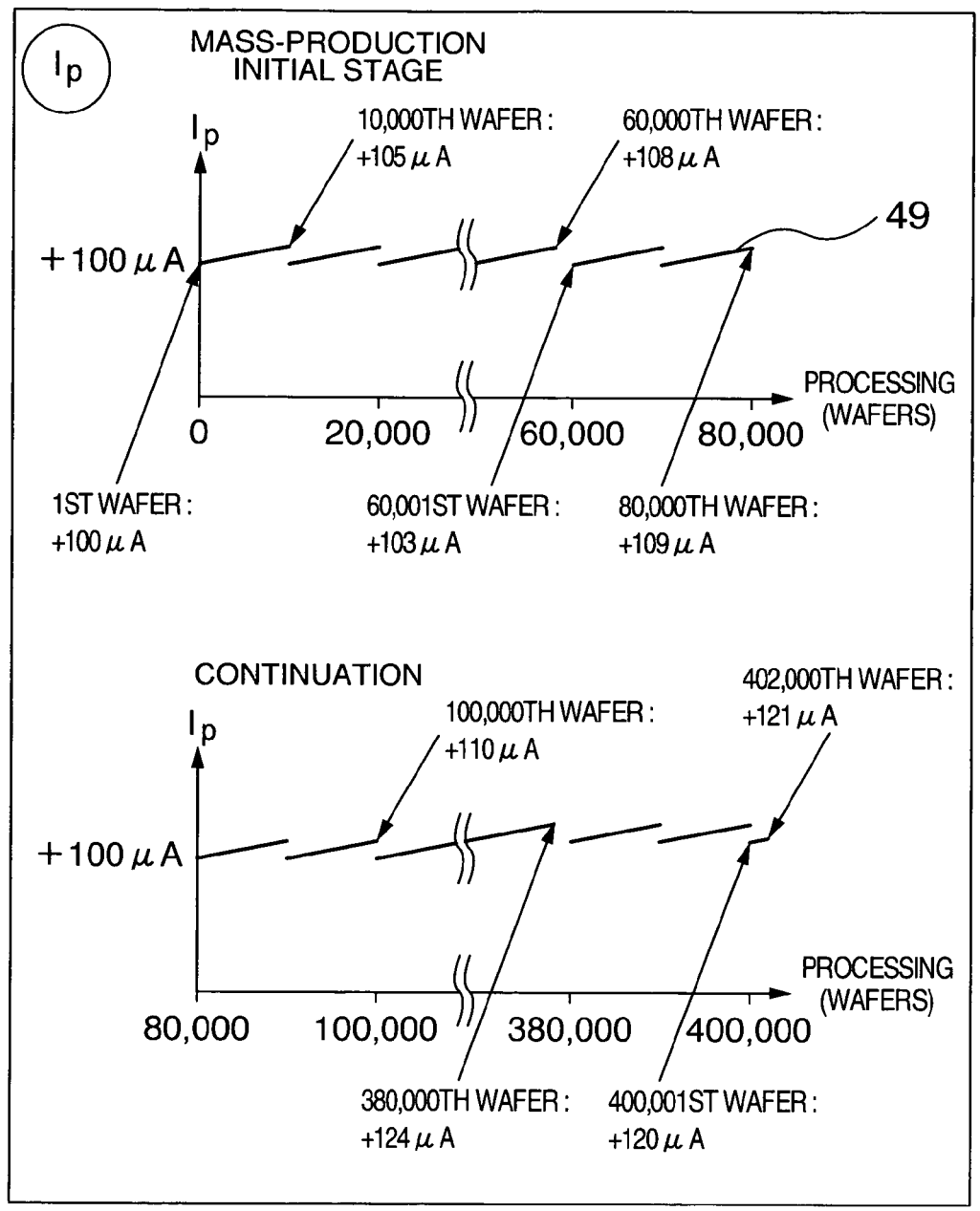
FIG. 8 is a diagram to explain history data of the monitor value Ip from when the mass-production is started to when the number of processed wafers exceeds 400000.

FIG. 8 shows the history data of the monitor value Ip from the mass-production start point to when the number of processed wafers exceeds 400000. As described in conjunction with the first embodiment 1, although the pulsating variation is actually detected in the direct current 28 of the wafer attracting power source 16 each time ten thousand wafers are processed, points of data items of the pulsating variation are not shown in FIG. 8.

A check is made to determine whether or not the variation in the monitor value Ip=+100 µA takes place for a long period of time by detecting the monitor value in detail. As indicated by a direct current 49, while Ip is +100 µA in the processing of the first wafer in the mass-production initial stage, the value of Ip slightly and gradually increases up to +105 µA when the 10000th wafer is processed. It is confirmed that the value of Ip similarly increases by 5 µA when 10000 wafers are processed also after this point of time. On the other hand, the check is made by replacing the cylindrical inner parts 17 each time ten thousand wafers are processed. For example, the inner parts 17 are replaced after the mass-production is finished for the 60000th wafer. The value of Ip when the 60001st wafer is processed after the replacement is by 5 µA less than that before the replacement.

However, the monitor value of Ip does not repeatedly vary as Ip=+100 µA→Ip=+105 µA each time ten thousand wafers are processed, but there also appears a long-term variation. Observing only the data immediately after the replacement of the cylindrical inner parts 17, the value is +100 µA for the first wafer and then increases up to +103 µA for the 60001st wafer. When the mass-production is conducted up to the 400001st wafer, the value reaches +120 µA. According to the overall data items recognized as above, it is determined that the value of Ip slightly and gradually varies for a long period of time. For each period in which the inner parts 17 are completely used up for ten thousand wafers, the value increases 5 µA. The value returns to almost the original value when the inner parts 17 are replaced. However, in a long period of time, the value increases at a rate of 5 µA per ten thousand wafers. It is resultantly confirmed that the value is +120 µA when the 400001st wafer is processed.

According to the various variations in the data, it is determined that these variations are caused by a combination of the increase of 20 µA in the direct current 28 of the wafer attracting direct current 16 resultant from the change in the film thickness and the film quality of the wafer attracting film 11 on the upper surface of the sample stage 5 as a result of the mass-production of 400000 wafers and the increase of 5 µA in the direct current 28 resultant from the change in the film thickness and the film quality of the wafer attracting film 11 as a result of the mass-production of ten thousand wafers.

After having processed 400000 wafers, the mass-production is continued up to the 402000th wafer. The value of Ip increases up to +125 µA as in the processing described above, and hence the mass-production is carried out up to the 410000th wafer to resultantly confirm the increase of Ip up to +125 µA. Thereafter, the cylindrical inner parts 17 are replaced as above.

When the sample stage 5 (including the wafer attracting film 11 disposed on the upper surface thereof) is replaced with a new sample stage at timing of the replacement of the inner parts 17, the value of Ip is returned to +100 μA for the 410001st wafer. This value is 20 μA less than the value of +120 μA for the 400001st wafer. As a result, it is confirmed that the variation can be classified as below. The long-term variation of 20 μA up to the 400000th wafer represents the variation in the film thickness or quality of the wafer attracting film 11. The variation of 5 μA observed each time ten thousand wafers are processed represents the variation in the film thickness or quality of the inner wall protective coating 8 on the surface of the inner parts 17.

As above, the variation in Ip reflects the variation of the protective coating 8 for each processing of ten thousand wafers and the variation of the wafer attracting film 11 varying with a long period of time. If the tendency of the long-term variation is appropriately obtained, the variation in Ip can be used as information to determine life of the wafer attracting film 11.

On the other hand, to simulate a defective product, the etching characteristic is obtained in another apparatus of the same type using a sample stage A of which the film thickness of the wafer attracting film 11 is intentionally reduced by 30% and a sample stage B of which the film thickness of the wafer attracting film 11 is intentionally reduced by 40%.

As in the above example, for the 20% increase in Ip, the variation in the etching rate and the fine pattern etching dimension is small and within the range of allowance. However, for the sample stage A with the 30% reduction of the film thickness, the variation is near the limit of the allowance, although within the range of allowance. For the sample stage B with the 40% reduction of the film thickness, the variation is beyond the range of the allowance. Assume that, for example, the 30% film thickness reduction (or 30% resistance reduction due to the film quality variation) is set as the control reference. In operation, immediately after the replacement of the cylindrical inner parts 17 covered with the inner wall protective coating 8, the Ip value is checked using the 30% increase in the Ip value as a threshold value. If the Ip value exceeds the threshold value, the sample stage 5 (including the wafer attracting film 11 disposed on the upper surface thereof) is replaced with a new sample stage. This makes it possible to continue the mass-production while keeping the etching rate and the fine pattern machining dimension within the range of allowance in a stable state. In the description, a defective product is assumed in the example by intentionally reducing the film thickness of the wafer attracting film 11. However, if different apparatuses respectively include parts with mutually different film thickness values, there naturally exists difference between the apparatuses (machine difference). Also in such a situation, the monitor values of the present invention are applicable to determine which parts are the cause of the machine difference.

In the description of the fourth embodiment, the inner wall protective coating 8 and the wafer attracting film 11 are worn through the mass-processing with the etching recipe kept unchanged. Using a recipe other than those used in the mass-production, a deposit film of deposited substance is formed in another apparatus by use of a deposition gas on the protective coating 8 and the wafer attracting film 11. The variation in Ip is observed in two cases, namely, a case in which a wafer is placed on the sample stage 5 to conceal the wafer attracting film 11 to thereby form the deposit film on the protective coating 8 and a case in which the deposit film is formed on the wafer attracting film 11 and the protective coating 8 without placing a wafer on the sample stage 5. It is confirmed that the monitor values vary in a direction completely opposite to that of the variation when the wearing occurs in the fourth embodiment. In this way, it is possible to monitor the state in the chamber in a similar manner not only for the wearing of the dielectric film in the chamber but also for the deposition of a film thereon.

In the fourth embodiment, when Ip increases 20%, the variation in the real part Rb and the imaginary part Xb of the impedance $Zb=Rb+jXb$ viewed from the bias applying high-frequency wave and the peak-to-peak voltage value Vpp of the bias applying high-frequency wave is less than 20%, i.e., several percent. However, when Ip increases 30% or 40%, a slight change appears in Rb, Xb, and Vpp.

As described above, to detect the variation in the wafer attracting film on the upper surface of the sample stage 5, it is necessary to monitor the variation in Ip as the primary monitor value. However, it is desirable to refer to also the variation in Rb, Xb, and Vpp. It has been recognized that the short-term variation in the film of the inner protective coating 8 on the surface of the cylindrical inner parts 17 can also be monitored in this method. By appropriately confirming the gradual long-term variation beginning at the mass-production initial stage, the maintenance timing and the parts to be replaced are predictable, and the prediction can be used for the operation of the mass-production.

Fifth Embodiment

Description will now be given of an example in which the insulation breakdown in the inner wall protective coating 8 on the surface of the cylindrical inner parts 17 is beforehand predicted such that the plasma potential or the voltage of the wafer attracting power source 16 is lowered to thereby prevent the insulation breakdown to extend the interval of time for the replacement of the inner parts 17 as long as possible.

As described in conjunction with the first embodiment, the insulation breakdown takes place in the protective coating 8 on the inner parts 17 each time ten thousand wafers are processed. To possibly elongate the period of time before the replacement of the inner parts 17 in this situation, it is desired to prevent, by use of the monitor and control, the occurrence of the pulsating variation due to the insulation breakdown to resultantly process as many wafers as possible.

As described for the first embodiment, when the insulation breakdown occurs in the protective coating 8 on the inner parts 17, there appears the Ip variation at the 100 μs level. Simultaneously, there also appears the plasma potential variation at the one second level as shown in FIG. 4. That is, the Ip variation is an instantaneous phenomenon at the 100 μs level. Before the pulsating variation, the insulation breakdown has already occurred in the protective coating 8. Before the pulsating variation in Ip, there is not observed any monitor value variation to be regarded as an indication of the variation. Therefore, it is difficult to control prevention of the pulsating variation by using Ip as the reference signal. That is, before the signal is received, the variation has already taken place.

On the other hand, by observing in detail the plasma potential Pp shown in FIG. 4, it is recognized that the feature thereof can be attained in a stage before Pp enters the pulsating variation.

Figure 9:
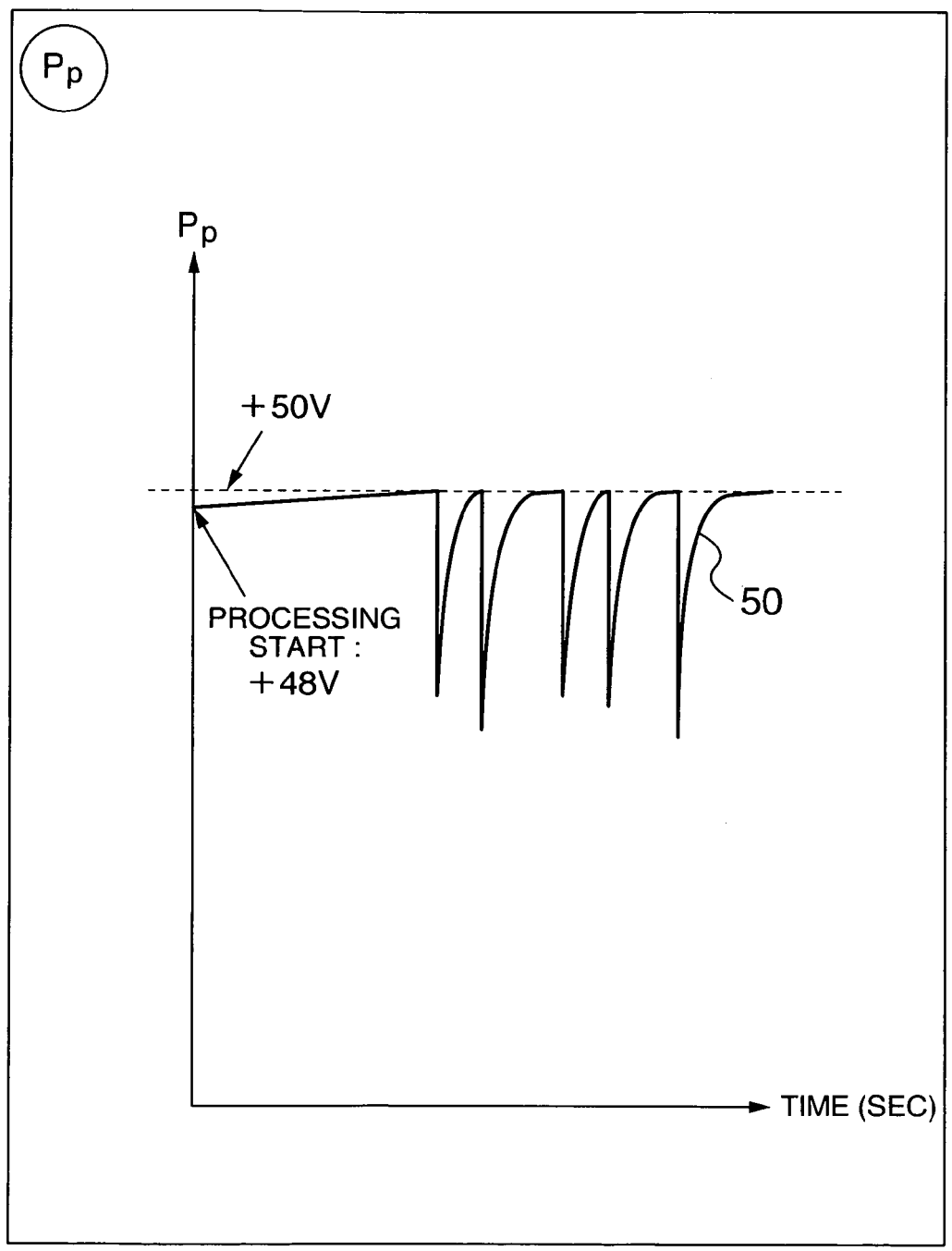
FIG. 9 is a magnified view showing a waveform of FIG. 4.

FIG. 9 shows a magnified view of the waveform of FIG. 4 in the vicinity of a point where the pulsating variation appears in the monitor value. In FIG. 4, it seems that the Pp value is at +50 V, namely, is almost fixed when the pulsating variation is absent. However, when the waveform is magnified in the vertical direction to observe the waveform in detail, Pp is actually +48 V at the processing start point and gradually increases up to +50 V. When the value of Pp reaches +50 V, the insulation breakdown occurs in the protective coating 8.

Thereafter, the insulation breakdown occurs in the protective coating 8 each time Pp reaches +50 V although the interval of time slightly varies according to the magnitude of undershoot of the waveform of Pp. It can be hence regarded that the insulation breakdown is a phenomenon in which when the plasma potential 50 is equal to or more than a threshold value, the strength of the protective coating 8 is insufficient and is hence broken.

In this connection, several causes can be considered for the gradual increase in the plasma potential Pp. For example, due to the long-term use, the resistance of the wafer attracting film 11 on the upper surface of the sample stage 5 is reduced; the density of the plasma 9 is lowered for some other reasons; or the distribution of the plasma 9 is slightly changed. Even when the resistance of the wafer attracting film 11 is changed a bit, there does not occur any problem for the use of the plasma processing apparatus if the wafer 4 can be appropriately attracted by the attractive force. Even when the density and the distribution of the plasma 9 vary, the apparatus can be continuously operated if the variation is within the range of allowance. However, if the breakdown occurring in the protective coating 8 is serious, it is not possible to continuously use the apparatus depending on cases, for example, the wafer 4 is contaminated or an adverse influence of dust particles takes place. Therefore, although the slight variation in the wafer attracting film 11 and the slight variation in the density and the distribution of the plasma 9 are allowed, it is required to avoid the breakdown of the inner wall protective coating 8.

According to the idea described above, an attempt is made to prevent the insulation breakdown using two methods to elongate the replacement period to replace the cylindrical inner parts 17 on the protective coating 8 by new inner parts. The attempt is confirmed by conducting a test at timing when 420000th wafers are processed in total in the mass-production.

In the first method, the plasma potential Pp is monitored. When the potential increases and reaches +49 V, the apparatus is controlled to reduce the applied voltage Vp applied from the wafer attracting power source 16 to the sample stage 5 by 10 V. In this regard, the applied voltage from the power source 16 to the sample stage 5 is fixed to +300 V in the first embodiment.

FIG. 10 shows variations in the plasma potential 51, i.e., Pp and the wafer attracting power source voltage 52, i.e., Vp applied from the power source 16 to the sample stage 5 in an operation in which control is conducted to reduce the voltage value Vp when the plasma potential Pp increases.

As shown in FIG. 10, when the plasma potential Pp reaches +49 V for the first time, control is conducted to reduce the dc voltage 52 from +300 V to +290 V. In this situation, the plasma potential 51 gradually increases again up to +49 V. The dc voltage 52 is again controlled to be reduced from +290 V down to +280 V.

By conducting the control operation, the pulsating variation of FIG. 9 disappears, and there appears a waveform without the pulsating variation as shown in FIG. 10. That is, the plasma potential 51 is controlled not to exceed a predetermined upper-limit value (49 V in this case). The voltage applied from the power source 16 to the sample stage 5 is monitored as Vp and indicated by the dc voltage 52.

In the condition under the control operation, the mass-production can be continuously carried out for a while. However, when 425000 wafers are processed in total, even when it is attempted to restrict the maximum value of the plasma potential 51 to be kept at +49 V, the pulsating variation appears. In this condition, it can be estimated that the thickness of the protective coating 8 on the inner parts 17 has been reduced. It is consequently determined that the strength of the coating 8 against the insulation breakdown is being decreased, and hence the mass-production is interrupted when the 425000th wafer is processed. As a result, when compared with the above case in which the inner parts 17 are replaced each time ten thousand wafers are processed, the replacement period of parts can be elongated by the control operation to lower the dc voltage applied to the sample stage 5. That is, the inner parts 17 are to be replaced each time 15000 wafers are processed.

In the second method, the limit of the maximum value of the plasma potential is changed from +49 V to +48 V when the 425000th wafer is processed. By detecting the appearance of the pulsating variation, it is possible to reduce the limit of the maximum value of the plasma potential 51 by one volt. Therefore, automatic control is possible in the second method.

The method in which the limit of the maximum value of the plasma potential 51 is reduced by one volt after detecting the pulsating variation is a method to control the value by directly observing the phenomenon. Therefore, the control is simple and can be easily conducted. However, depending on the magnitude of the pulsating variation, it is likely that the associated wafer is damaged and becomes unusable.

To conduct the control operation before the pulsating variation is detected, it is possible to apply the method in which the variation in Rb, Xb, and Vpp is also monitored together with the variation in Ip in association with the variation in the film thickness and the film quality of the protective coating 8 on the surface of the inner parts 17 as described in conjunction with the fourth embodiment. In this situation, according to the trend of the variation in Ip and the trend of the variation in Rb, Xb, and Vpp, a database, which is beforehand generated to separate the variation in the protective coating 8 from the variation in the wafer attracting film 11, can be used to predict the pulsating variation.

While stepwise reducing the limit of the maximum value of the plasma potential 51 from +49 V to +48 V, +47 V, and so on, the mass-production is continuously carried out up to the 430000th wafer. In the resultant state, the limit of the maximum value of the plasma potential 51 is reduced to +40 V and the dc voltage applied from the wafer attracting power source 16 to the sample stage 5 is reduced to +210 V.

In this situation, the wafer attracting force is below the allowed value, that is, the wafer attraction is insufficient in the plasma processing apparatus and hence the apparatus has issued an error message of the condition. Therefore, the mass-production is stopped by the 430000th wafer. In the control method to reduce the limit of the maximum value of the plasma potential, the mass-production can be continuously conducted further for 5000 wafers. The replacement period of the replacement of the inner parts 17 can be elongated, namely, the inner parts 17 are replaced each time 20000 wafers are processed.

When the dc voltage applied from the wafer attracting power source 16 to the sample stage 5 is gradually lowered, the wafer attracting force finally becomes insufficient. It is recognized that to prevent the insulation breakdown of the protective coating 8 on the surface of the inner parts 17, the dc voltage applied to the sample stage 5 is favorably decreased, but the wafer attracting force sets limits on the decrease in the dc voltage. When the dc voltage is further reduced, for example, down to a negative value, e.g., −500 V, the wafer attracting force can be again increased. However, even if the dc voltage is set to the negative value, it is necessary to set the applied voltage to a higher value to increase the wafer attracting force as in the above case. Therefore, the present invention is also applicable regardless of the positive or negative value of the applied voltage.

Sixth Embodiment

Description will now be given of the sixth embodiment of the plasma processing apparatus. In this example, the plasma generating high-frequency wave is introduced from the sample stage disposed in the lower section of the chamber, not through the vacuum window in the upper section of the chamber.

Figure 11:
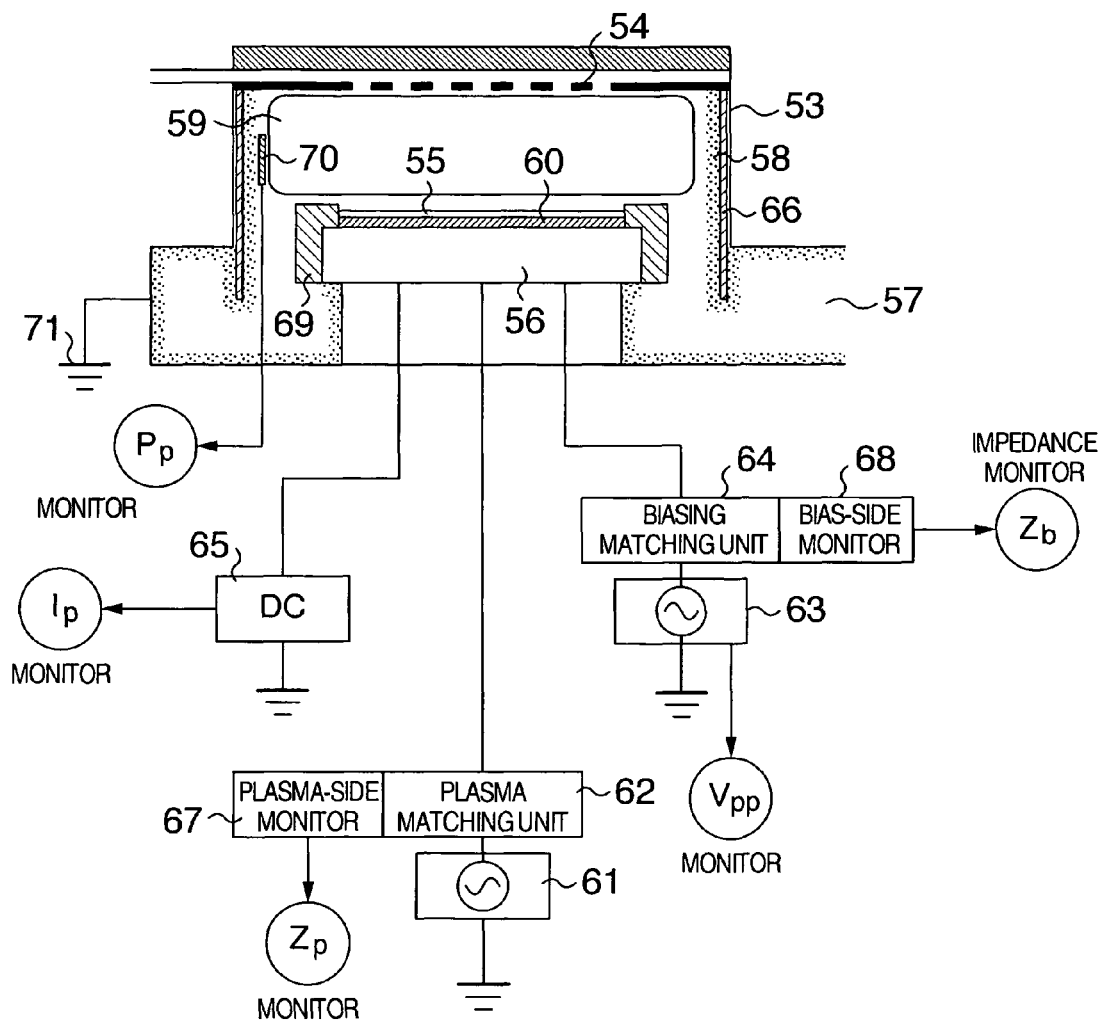
FIG. 11 is a diagram to explain a plasma processing apparatus in which the plasma generating high-frequency power is introduced from a sample stage arranged in a lower section of the chamber.

FIG. 11 is a diagram to explain a plasma processing apparatus in which the plasma generating high-frequency power is introduced from a sample stage arranged in a lower section of the chamber. As shown in FIG. 11, the high-frequency wave generated from a plasma generating power source 61 is introduced via a plasma matching unit 62 from the side of a sample stage 56 disposed in a lower section of a chamber 53. In this connection, a gas injection plate 54, a gas outlet 57, cylindrical inner parts 66 with an inner wall protective coating 58 thereon, a wafer 55, a sample stage 56, a wafer attracting film 60, a susceptor 69, a bias power supply 63, a biasing matching unit 64, and a wafer attracting dc power source 65 which are disposed in the chamber 53 are similar to the associated components of FIG. 1.

While the reactive gas kept at a pressure typically ranging from about 0.5 Pa to about 10 Pa is being injected from the gas injection plate 54 into the chamber 53, the high-frequency wave power is applied from the power source 61 through the plasma matching unit 62 to the sample stage 56. This resultantly generates plasma 59 in the chamber 53. With the wafer 55 exposed to the plasma 59 in the chamber 53, the wafer attracting dc voltage and the high-frequency bias are applied to the wafer 55 to thereby carry out the etching process.

In this state, the impedance Zp of the chamber 53 viewed from the plasma generating power source (first power source) is monitored by an impedance monitor 67 on the plasma generating side disposed in the plasma matching unit 62 or in the vicinity thereof. Also, the impedance of the chamber 53 viewed from the bias applying power supply (second power source) is monitored by an impedance monitor 68 on the bias applying side disposed in the biasing matching unit 64 or in the vicinity thereof. The peak-to-peak value Vpp of the high-frequency voltage when the high-frequency wave is applied from the bias power supply 63 to the sample stage 56 is monitored. Additionally, the applied voltage Vp or the direct current Ip applied from the wafer attracting power source 65 to the sample stage 56 is monitored. Although the plasma generating power source 61 and the bias power supply 63 apply the voltage or current to the one and the same sample stage 56, the impedance Zp viewed from the plasma generating high-frequency wave and the impedance Zb viewed from the bias applying high-frequency wave can be independently monitored since mutually different frequencies are used. Furthermore, the peak-to-peak value Vpp of the high-frequency voltage in the sample stage 56 can be discriminated from the plasma generating high-frequency wave in the detection thereof.

In the sixth embodiment, the variation and the abnormality in the chamber 53 can be detected by monitoring the four values Zp, Zb, Vpp, and Ip in the plasma processing apparatus shown in FIG. 11. Description will now be given of the difference in operation between the sixth embodiment and the first to fifth embodiments.

The insulation breakdown in the protective coating 8 on the surface of the inner parts 66 described for the first embodiment is a pulse-shaped phenomenon occurring in quite a short period of time. Therefore, no variation appears in Zp, Zb, and Vpp in the initial stage of occurrence of the variation. The pulsating variation appears in the direct current, i.e., Ip of the wafer attracting power source 65. Although the plasma generating power source 61 is coupled with the plasma matching unit 62 at a position different from that of the first embodiment, the point for the determination on the basis of the monitor value of the direct current Ip is substantially the same as that of the first embodiment. The abnormality can be detected almost in the same way as for the first embodiment.

For the abnormal discharge in the vicinity of the sample stage 56 or the susceptor 69 covering the sample stage 56 described in conjunction with the second embodiment, a variation appears in Zb, Vpp, and Ip. In the second embodiment, the plasma generating high-frequency wave is introduced from the vacuum window in the upper section of the chamber. Therefore, the abnormal discharge in the vicinity of the sample stage and the susceptor does not exert influence upon Zp. However, in the sixth embodiment, the plasma generating high-frequency wave is applied to the sample stage to which the bias applying high-frequency wave and the wafer attracting dc voltage are applied, and hence a variation is also observed in Zp.

The abnormal discharge in the gap between the vacuum window and the gas injection plate and in the vicinity of pinholes to inject gas described in conjunction with the third embodiment is not likely to occur in the method of the sixth embodiment and cannot be detected since the plasma generating high-frequency wave is not introduced through the vacuum window. In the method of the sixth embodiment, consideration is to be given to an event that the abnormal discharge likely occurs on the side of the sample stage 56 to which the wafer attracting dc voltage and the bias applying high-frequency wave are applied. In the third embodiment, when a variation is detected in each of Zp, Zb, Vpp, and Ip, the abnormality is classified as an abnormality in the vicinity of the vacuum window and the gas injection plate. However, in the sixth embodiment, when a variation is detected in each of Zp, Zb, Vpp, and Ip, the abnormality is classified as abnormal discharge in the vicinity of the sample stage 56 or susceptor covering the sample stage 56.

For the variation in the film thickness and quality of the wafer attracting film 60 arranged on the surface of the sample stage 56 and the protective coating 58 disposed on the surface of the cylindrical inner parts 66 described in conjunction with the fourth embodiment, the primary variation appears in Ip and a slight variation appears in Zb and Vpp. This also applies to the sixth embodiment. In the sixth embodiment, unlike in the fourth embodiment, a slight variation also takes place in Zp. However, since the primary monitor signal Ip varies as in the fourth embodiment, these signals can be discriminated from each other.

The prevention of the insulation breakdown in the protective coating 58 on the inner parts 66 by controlling the wafer attracting power source voltage Vp with reference to the plasma potential Pp described for the fifth embodiment is similarly applicable regardless of the position to which the plasma generating high-frequency wave and the bias applying high-frequency wave are applied.

Seventh Embodiment

Figure 12:
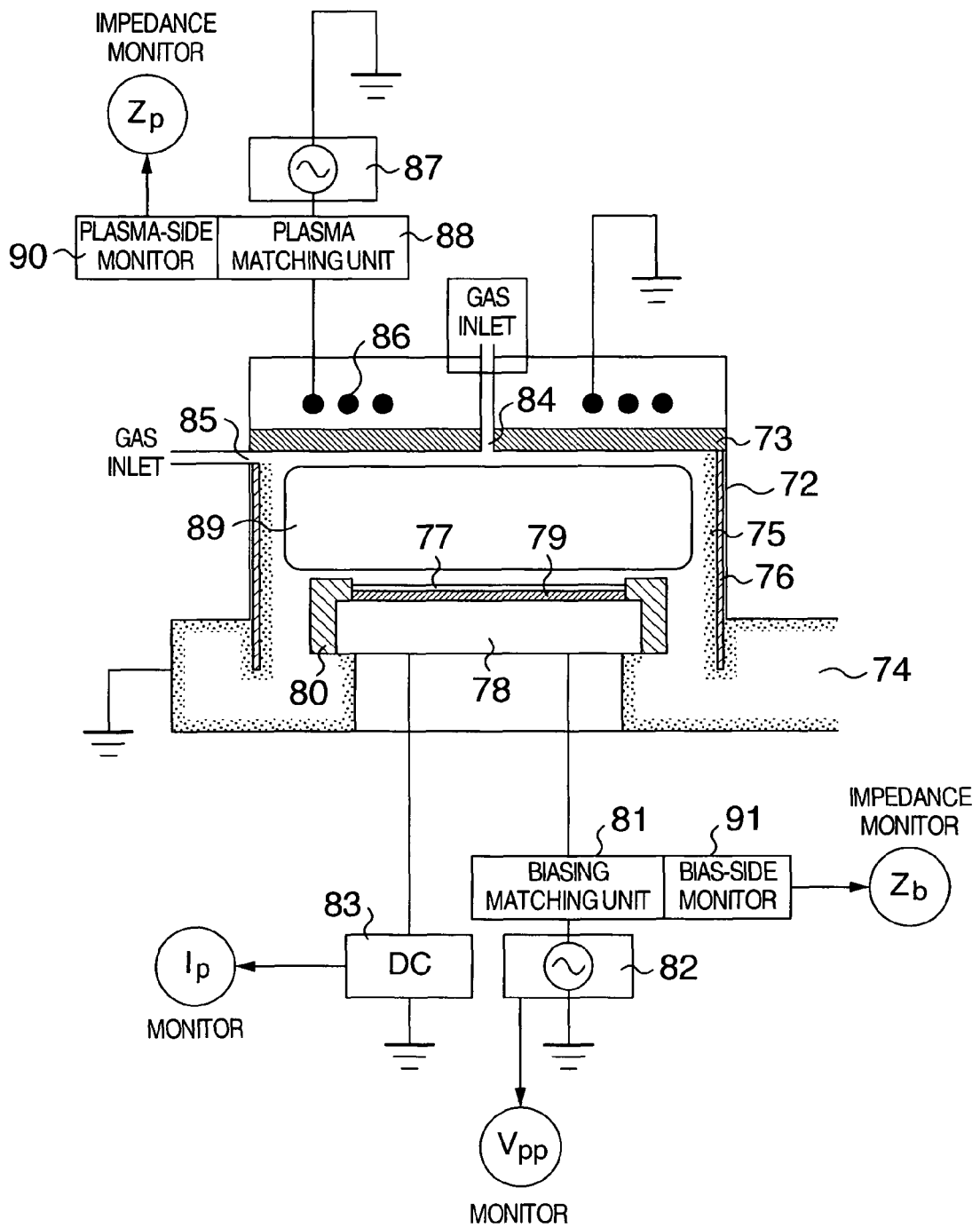
FIG. 12 is a diagram to explain a plasma processing apparatus in which the plasma generating high-frequency power is introduced from a dielectric vacuum window arranged in an upper section of the chamber and a gas inlet is disposed at a position apart from an area with high electric field intensity caused by a plasma generating high-frequency wave.

Description will now be given of the seventh embodiment with reference to example of a plasma processing apparatus in which the plasma generating high-frequency wave is introduced from the vacuum window disposed in the upper section of the chamber and the gas inlet is disposed at a position apart from the area of a strong electric field due to the plasma generating high-frequency wave as shown in FIG. 12.

FIG. 12 is a diagram to explain a plasma processing apparatus in which plasma generating high-frequency power is introduced from the vacuum window in the upper section of the chamber and the gas inlet is arranged apart from the area of the high electric field intensity caused by a plasma generating high-frequency wave. In the apparatus, the gas injection plate to introduce the reactive processing gas is not disposed just beneath the vacuum window. That is, the gas is introduced from the gas inlet disposed at a position apart from the strong electric field of the plasma generating high-frequency wave.

In a chamber 72 for the plasma processing, a dielectric vacuum window 73 is disposed in an upper section thereof to introduce a high-frequency wave of RF band to generate plasma. In the apparatus, unlike in the plasma processing apparatuses described by referring to FIG. 1 or 11, the processing gas is introduced to the chamber 72 through either one or both of a central gas inlet 84 disposed at a central section of a vacuum window 73 and a peripheral gas inlet disposed in a periphery thereof, the inlets 84 and 85 being apart from the position of a loop antenna 86 to introduce the plasma generating high-frequency wave.

Reaction products resultant from the etching processing are discharged through an outlet 74 in a lower section of the chamber 72. Cylindrical inner parts 76 are disposed on a side-wall section inside the chamber 72. In the parts 76, an inner wall protective coating 75 is formed on a surface of a base metal of aluminum. A wafer 77 to be etched is placed on an electrostatic chuck including a wafer attracting film 79 of a dielectric (high resistance) material disposed on an upper surface of the sample stage 78. The wafer 77 is attracted by electrostatic force. By filling helium gas in a gap between the wafer 77 and the film 79, heat transfer between the wafer 77 and the film 79 on the upper surface of the sample stage 78 is secured to thereby control the temperature of the wafer 77. The periphery of the sample stage 78 is covered with a dielectric susceptor 80. The sample stage 78 is connected to a biasing matching unit 81 and a bias power supply 82 to apply a high-frequency bias to the wafer 77 and a wafer attracting power source 83 to attract the wafer 77 by electrostatic force.

While the reactive gas kept in the chamber 72 at a pressure typically ranging from about 0.5 Pa to about 10 Pa is being injected from either one or both of the central gas inlet 84 and the peripheral gas inlet 85 into the chamber 53, the high-frequency wave power of the RF band is applied from the plasma generating power source 87 through the plasma matching unit 88 and the loop antenna 86 disposed in an outer side (atmosphere side) relative to the vacuum window 73 to the chamber 72 to thereby generate plasma 89. In the state in which the wafer attracting dc voltage and the high-frequency bias is applied to the wafer 77 in the chamber 72, the wafer 77 is exposed to the plasma 89 in the chamber 89 to carry out the etching process.

The plasma processing apparatus of the seventh embodiment differs from the apparatus shown in FIG. 1 or 11 in that the gas inlets are arranged respectively in the central and peripheral sections of the vacuum window where the electric field of the high-frequency wave emitted from the loop antenna to generate plasma is weak. In the seventh embodiment, the gas outlet 74 in the chamber 72, the inner parts 76 with the protective coating 75 thereon, the wafer 77, the sample stage 56, the wafer attracting film 60, the susceptor 80, the bias power supply 82, the biasing matching unit 81, and the wafer attracting power source 83 are similar to the associated constituent components of the apparatus shown in FIG. 1 or 11. The apparatus of the seventh embodiment is similar to that of FIG. 1 in that the power from the plasma generating power source 87 is introduced through the plasma matching unit 88 and the loop antenna 86 disposed in an outer side (atmosphere side) relative to the vacuum window 73 to the chamber 72. However, since these apparatuses differ in the antenna configuration from each other, the electric field is weak in the central and peripheral sections of the chamber and is strong in a middle section (in a section thereof below the loop antenna).

The monitor position of the seventh embodiment is almost the same as for the apparatus of the first embodiment. The impedance $Zp$ of the chamber viewed from the plasma generating high-frequency wave (first high-frequency wave) is monitored by an impedance monitor 90 on plasma generating side disposed in the plasma matching unit 88 or in the vicinity thereof. The apparatuses differ from each other in the configuration of the antenna and cable coupling sections as well as in the frequency of the plasma generating high-frequency wave, but are in principle almost equal to each other in that the apparatuses monitor the impedance of the plasma viewed from the plasma generating high-frequency wave introduced from the upper section of the chamber.

The impedance $Zb$ of the chamber viewed from the bias applying high-frequency wave (second high-frequency wave) is monitored by an impedance monitor 91 on bias applying side disposed in the biasing matching unit 81 or in the vicinity thereof. The peak-to-peak value $Vpp$ of the high-frequency voltage when the high-frequency wave is applied from the bias power supply 82 to the sample stage 78 is monitored. Also, the applied dc voltage $Vp$ or the direct current $Ip$ of the wafer attracting power source 83 applied to the sample stage 78 is monitored.

In conjunction with the present embodiment, description will be given of an example slightly different from the embodiment of the plasma processing apparatus shown in FIG. 1. Specifically, in the example, the vacuum window 73 to introduce the plasma generating power disposed in the upper section of the chamber is worn in the plasma processing apparatus of FIG. 12.

While monitoring the four values $Zp$, $Zb$, $Vpp$, and $Ip$, the mass-production is carried out in the plasma processing apparatus of FIG. 12. In the apparatus, the processing condition includes "the cleaning condition" and "etching condition" similar to those of the first embodiment although the plasma distribution and density slightly differ from those of the first embodiment due to the difference in the apparatus configuration. When ten thousand wafers are processed after the mass-production is started, a pulsating monitor signal is detected also in the apparatus as in the first embodiment. It is recognized that the signal indicates, as in the first embodiment, the insulation breakdown in the protective coating 75 on the inner parts 76. The mass-production is continuously conducted thereafter up to the 300000th wafer while replacing the inner parts 76 each time ten thousand wafers are processed. According to the monitor values of $Zp$, $Zb$, $Vpp$, and $Ip$ observed in a range from when the mass-production is started to when 300000 wafers are processed, the monitor value $Ip$ varies in a way similar to that of FIG. 8. The monitor value variation reflects the variation in the wafer attracting film 79 on the sample stage 78 in a long period of time and the variation in the protective coating 75 on the inner parts 76 repeatedly appearing at an interval of ten thousand wafers. On the basis of the monitor values of $Zp$, $Zb$, and $Vpp$, there is confirmed an aspect different from that of the apparatus shown in FIG. 1. Specifically, the value $Zp$ considerably varies (decreases). Also, a slight variation appears in Zb and Vpp although the variation is few percent.

Also in this situation, the abnormal kind is classified as follows. Since the largest variation appears in the impedance Zp viewed from the plasma generating high-frequency wave, it is assumed that the abnormality takes place in the vacuum window 73 disposed in the upper section of the chamber 72. However, there does not exist a gas injection (dispersion) plate in the vicinity of the vacuum window in the plasma processing apparatus of FIG. 12. Therefore, the pulsating variation does not appear in the monitor value, as the variation in the monitor value (FIG. 6) when the abnormal discharge occurs, for example, in the gap between the vacuum window and the gas injection plate. That is, the value of the impedance Zp remarkably varies. According to the fine-pattern etching characteristic of the 300001st wafer immediately after the replacement of the inner parts 76 with new parts, it is recognized that the etching characteristic items such as the etching rate and the etching completion dimension are slightly beyond the range of allowance. The mass-production is stopped at this point and then the vacuum window 73 is replaced with a new vacuum window. The removed window is inspected in detail to detect the state thereof as below. With the vacuum window in the assembled state, the dielectric material is shaved at a position just beneath the loop antenna 86 (the middle position between the center and the periphery), and hence the vacuum window is thinner in the shaved section. On the other hand, according to the fine-pattern etching characteristic obtained after replacing the vacuum window 73 with a new vacuum window, the characteristic items are within the range of allowance. It is hence confirmed that the remarkable variation in, particularly, Zp is appropriately classified as a kind of abnormality caused by the reduction in thickness of the vacuum window to introduce the plasma generating high-frequency wave.

If the thickness of the vacuum window varies, the impedance Zp viewed from the plasma generating high-frequency wave side changes in association with the variation in the electric characteristic of the vacuum window even if the plasma characteristic is kept unchanged. Actually, a slight variation occurs in Vpp and Zb and the etching characteristic varies to be beyond the range of allowance. That is, in the present embodiment, the variation in the electric characteristic of the vacuum window results in the remarkable variation in Zp. On the other hand, the variation in the thickness of the vacuum window causes the variation in the plasma density and distribution. It can be estimated that this influence leads to the variation of several percent in Vpp and Zb.

While the pulsating variation in the monitor value due to the abnormal discharge in the vicinity of the vacuum window and the gas injection plate appears before the monitor value variation due to the reduction in thickness of the vacuum window in the third embodiment, the abnormality due to the wearing of the vacuum window at a position just beneath the loop antenna 6 appears more remarkably than the abnormality in the vicinity of the central gas inlet 84 and the peripheral gas inlet 85. In the third embodiment and the present embodiment, the abnormality takes place in the vacuum window in the upper section of the chamber. Resultantly, while the abnormal discharge occurs in the third embodiment, the remarkable wearing appears in the present embodiment. The state of the abnormality varies between the third embodiment and the present embodiment. However, inherently, the wearing of the vacuum window and the wearing in the vicinity of the gas inlets take place in both embodiments. The difference resides in that which one of these events first causes the problem. In the plasma processing apparatus of FIG. 1 in which the electric field is relatively uniform in the vicinity of the vacuum window, although the thickness of the vacuum window is slightly reduced, the wearing occurs in the gas inlet of the gas injection plate. In the apparatus of FIG. 12 of the present invention in which the electric field is weak in the vicinity of gas inlet, the gas inlet is worn to be widen at a low speed. However, in the section of the strong electric field, the wearing of the vacuum window is remarkable and hence first becomes the problem.

As described in the first to seventh embodiments, the peak-to-peak value Vpp of the high-frequency voltage applied to the sample stage is not essential to classify the variations and the abnormalities. Therefore, within the scope of the description above, it is required to monitor the three values Zp, Zb, and Ip. In the method in which the plasma generating high-frequency wave is introduced from the sample stage in the lower section of the chamber (including a case in which the plasma generating high-frequency wave is also used as the bias applying high-frequency wave), it is required to monitor two monitor values, i.e., either one of Zp and Zb and Ip.

In the first embodiment, the impedance is expressed as $Rp+jXp\Omega$ or $Rb+jXb\Omega$. However, the impedance may also be represented on a Smith chart using load voltage reflection coefficients. Or, there may be used, in place of the impedance, a value indicating a position of a mobile element of a matching unit, for example, a value which depends on impedance such as a position of a vacuum variable capacitor or a linear stub.

Alternatively, it is also possible that the events described in conjunction with the respective embodiments (the variations in the monitor values and the process of deterioration of parts associated with the variations) are accumulated as information items of a database to be stored in a control device, not shown. By combining the database with the monitor values, the control device can determine, for example, the variation or deterioration in parts with a lapse of time, presence or absence of an abnormality, a position of occurrence of the variation or abnormality, and a kind of the abnormality to display the determined items or to issue a warning message.

On the basis of the change of the monitor values with a lapse of time, it is possible to beforehand prepare parts to be replaced. This helps manage the maintenance of the plasma processing apparatus.

According to the embodiments of the present invention, not only by determining presence or absence of the variation or the abnormality in the chamber, but also by analyzing the variations in a plurality of monitor values and their characteristics, a position causing the variation or the abnormality and its kind is clarified to thereby beforehand predict a point of time at which the maintenance is required and parts to be replaced. Therefore, it is possible to prevent production of defective devices as well as to conduct, according to a schedule, the maintenance required in the mass-production using the plasma processing apparatus. This makes it possible to manage a long-term stable operation of the plasma processing apparatus.

The description has been given of the present invention by referring to operation of the etching apparatus. However, the present invention is broadly applicable to a processing apparatus to process samples by using plasma, for example, an ashing apparatus, a Chemical Vapor Deposition (CVD) apparatus, or a surface reforming apparatus.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, comprising:
a chamber in which inner parts with a protective coating thereon are disposed on an inner wall of the chamber;
a sample stage disposed in the chamber, the sample stage including a wafer attracting electrode on a sample placing surface thereof, the electrode being insulated from the sample stage by an insulating layer;
a gas introducing unit including a gas injection plate which disperses and introduces processing gas into the chamber;
a plasma generating high-frequency wave power source which supplies high-frequency wave energy to the processing gas introduced into the chamber to thereby generate plasma;
a bias applying high-frequency wave power supply which applies a high-frequency bias voltage to the sample stage;
a wafer attracting power source which applies a direct-current voltage to the wafer attracting electrode to attract a wafer, thereby conducting plasma processing for the sample placed on the sample stage using the plasma thus generated;
a wafer attracting current monitor for monitoring a current supplied from the wafer attracting power source;
an impedance monitor provided on a plasma generating side, for monitoring an impedance of the plasma viewed from the plasma generating high-frequency power source;
an impedance monitor provided on a bias applying side, for monitoring an impedance of the plasma viewed from the bias applying high-frequency power supply; and
a determining device for determining, based on monitor values measured by the monitors, a presence or an absence of abnormal discharge in the inner parts, a deterioration in insulation of the sample stage insulating the wafer attracting electrode, and an abnormal discharge in the gas injection plate,
wherein the determining device determines presence of insulation breakdown in the protective coating on the inner parts when the monitor value of the wafer attracting current monitor abruptly increases pulse-wise and no variation appears in the monitor value of the impedance monitor on the plasma generating side and the monitor value of the impedance monitor on the bias applying side.

2. The plasma processing apparatus according to claim 1, further comprising a plasma potential monitor for monitoring a potential of plasma, wherein the determining device determines a presence of insulation breakdown in the protective coating on the inner parts when the monitor value of the plasma potential monitor abruptly increases in a pulsating way and no variation appears in the monitor value of the impedance monitor on the plasma generating side and the impedance value of the impedance monitor on the bias applying side.

3. The plasma processing apparatus according to claim 1 further comprising a plasma potential monitor for monitoring a potential of plasma; and
the determining device reduces an output voltage from the wafer attracting power source to prevent abnormal discharge occurring in the inner parts, when the monitor value of the plasma potential exceeds a predetermined threshold value.

4. A plasma processing apparatus, comprising:
a chamber in which inner parts with a protective coating thereon are disposed on an inner wall of the chamber;
a sample stage disposed in the chamber, the sample stage including a wafer attracting electrode on a sample placing surface thereof, the electrode being insulated from the sample stage by an insulating layer;
a gas introducing unit including a gas injection plate which disperses and introduces processing gas into the chamber;
a plasma generating high-frequency wave power source which supplies high-frequency wave energy to the processing gas introduced into the chamber to thereby generate plasma;
a bias applying high-frequency wave power supply which applies a high-frequency bias voltage to the sample stage;
a wafer attracting power source which applies a direct-current voltage to the wafer attracting electrode to attract a wafer, thereby conducting plasma processing for the sample placed on the sample stage using the plasma thus generated;
a wafer attracting current monitor for monitoring a current supplied from the wafer attracting power source;
an impedance monitor provided on a plasma generating side, for monitoring an impedance of the plasma viewed from the plasma generating high-frequency power source;
an impedance monitor provided on a bias applying side, for monitoring an impedance of the plasma viewed from the bias applying high-frequency power supply; and
a determining device for determining, based on monitor values measured by the monitors, a presence or an absence of abnormal discharge in the inner parts, a deterioration in insulation of the sample stage insulating the wafer attracting electrode, and an abnormal discharge in the gas injection plate,
wherein the determining device determines presence of abnormal discharge on the sample stage when the monitor value of the impedance monitor on the bias applying side and the monitor value of wafer attracting current monitor vary in the form of a rectangular wave and no variation appears in the monitor value of the impedance monitor on the plasma generating side.

5. The plasma processing apparatus according to claim 4, further comprising a peak-to-peak voltage monitor for monitoring a peak-to-peak voltage of the bias applying high-frequency wave power supply, wherein the determining device determines presence of abnormal discharge on the sample stage when the monitor value of the impedance monitor on the bias applying side, the monitor value of the wafer attracting current monitor, and the monitor value of the peak-to-peak voltage monitor vary in the form of a rectangular wave and the impedance monitor on the plasma generating side detects no variation in its monitor value.

6. A plasma processing apparatus, comprising:
a chamber in which inner parts with a protective coating thereon are disposed on an inner wall of the chamber;
a sample stage disposed in the chamber, the sample stage including a wafer attracting electrode on a sample placing surface thereof, the electrode being insulated from the sample stage by an insulating layer;
a gas introducing unit including a gas injection plate which disperses and introduces processing gas into the chamber;

a plasma generating high-frequency wave power source which supplies high-frequency wave energy to the processing gas introduced into the chamber to thereby generate plasma;

a bias applying high-frequency wave power supply which applies a high-frequency bias voltage to the sample stage;

a wafer attracting power source which applies a direct-current voltage to the wafer attracting electrode to attract a wafer, thereby conducting plasma processing for the sample placed on the sample stage using the plasma thus generated;

a wafer attracting current monitor for monitoring a current supplied from the wafer attracting power source;

an impedance monitor provided on a plasma generating side, for monitoring an impedance of the plasma viewed from the plasma generating high-frequency power source;

an impedance monitor provided on a bias applying side, for monitoring an impedance of the plasma viewed from the bias applying high-frequency power supply;

a peak-to-peak voltage monitor for monitoring a peak-to-peak voltage of the bias applying high-frequency wave power supply; and a determining device for determining, based on monitor values measured by the monitors, a presence or an absence of abnormal discharge in the inner parts, a deterioration in insulation of the sample stage insulating the wafer attracting electrode, and an abnormal discharge in the gas injection plate, wherein the determining device determines presence of abnormal discharge on the gas injection plate when the monitor value of the impedance monitor on plasma generating side, the monitor value of the impedance monitor on bias applying side, the monitor value of the peak-to-peak voltage monitor, and the monitor value of the wafer attracting current monitor vary in the form of a rectangular wave.

7. A plasma processing apparatus, comprising:

a chamber in which inner parts with a protective coating thereon are disposed on an inner wall of the chamber;

a sample stage disposed in the chamber, the sample stage including a wafer attracting electrode on a sample placing surface thereof, the electrode being insulated from the sample stage by an insulating layer;

a gas introducing unit including a gas injection plate which disperses and introduces processing gas into the chamber;

a plasma generating high-frequency wave power source which supplies high-frequency wave energy to the processing gas introduced into the chamber to thereby generate plasma;

a bias applying high-frequency wave power supply which applies a high-frequency bias voltage to the sample stage;

a wafer attracting power source which applies a direct-current voltage to the wafer attracting electrode to attract a wafer, thereby conducting plasma processing for the sample placed on the sample stage using the plasma thus generated;

a wafer attracting current monitor for monitoring a current supplied from the wafer attracting power source;

an impedance monitor provided on a plasma generating side, for monitoring an impedance of the plasma viewed from the plasma generating high-frequency power source;

an impedance monitor provided on a bias applying side, for monitoring an impedance of the plasma viewed from the bias applying high-frequency power supply; and a determining device for determining, based on monitor values measured by the monitors, a presence or an absence of abnormal discharge in the inner parts, a deterioration in insulation of the sample stage insulating the wafer attracting electrode, and an abnormal discharge in the gas injection plate, wherein the determining device determines presence of deterioration in insulation of the insulating layer to insulate the wafer attracting electrode, in accordance with a history of the monitor value of the wafer attracting current monitor obtained each time the inner parts are replaced.

* * * * *